United States Patent
Inoue et al.

[11] Patent Number: 6,137,332
[45] Date of Patent: Oct. 24, 2000

[54] CLOCK SIGNAL GENERATOR AND DATA SIGNAL GENERATOR

[75] Inventors: Yoshiji Inoue; Yasuhiro Okazaki, both of Tokyo, Japan

[73] Assignees: Mitsubishi Denki Kabushiki Kaisha; Mitsubishi Electric Engineering Co., Ltd., both of Tokyo, Japan

[21] Appl. No.: 09/128,789

[22] Filed: Aug. 4, 1998

[30] Foreign Application Priority Data

Feb. 2, 1998 [JP] Japan .................................. 10-021015

[51] Int. Cl.$^7$ ........................................................ H03K 3/00
[52] U.S. Cl. ........................ 327/256; 327/293; 327/165; 327/291
[58] Field of Search ..................................... 327/141, 151, 327/156, 291, 299, 256, 293, 165; 331/1 A

[56] References Cited

U.S. PATENT DOCUMENTS

| | | | |
|---|---|---|---|
| 4,791,386 | 12/1988 | Shiga | 331/1 A |
| 5,097,489 | 3/1992 | Tucci | 375/120 |

FOREIGN PATENT DOCUMENTS

| | | |
|---|---|---|
| 60-174530 | 9/1985 | Japan . |
| 3241936 | 10/1991 | Japan . |
| 5227017 | 9/1993 | Japan . |
| 6326599 | 11/1994 | Japan . |
| 88738 | 1/1996 | Japan . |

Primary Examiner—Tuan T. Lam
Assistant Examiner—Hiep Nguyen
Attorney, Agent, or Firm—Leydig, Voit & Mayer

[57] ABSTRACT

A comparator compares phases of an input data supplied from an input terminal and a synchronizing clock signal output by a variable counter, and outputting a comparison result signal indicative of any of a "lead", a "lag" and a "non-detection" of the edge of the input data with respect to the up edge of the synchronizing clock signal. A state detector circuit detects the numbers of "leads" and "lags" in comparison result signals output by the comparator, and outputting a state detected signal indicative of any of "the number of leads is larger", "the number of lags is larger" and "the number of leads is equal to the number of lags". A dividing ratio selection circuit outputs a dividing ratio signal indicative of any of a "dividing ratio smaller than a reference dividing ratio", a "dividing ratio greater than the reference dividing ratio" and the "reference dividing ratio", based on the comparison result signals output by the comparator and state detected signals output by the state detector circuit. A variable counter divides the frequency of a reference clock signal in response to the dividing ratio signal output by the dividing ratio selection circuit and outputs the result of the division to the comparator and an output terminal.

12 Claims, 10 Drawing Sheets

FIG. 1
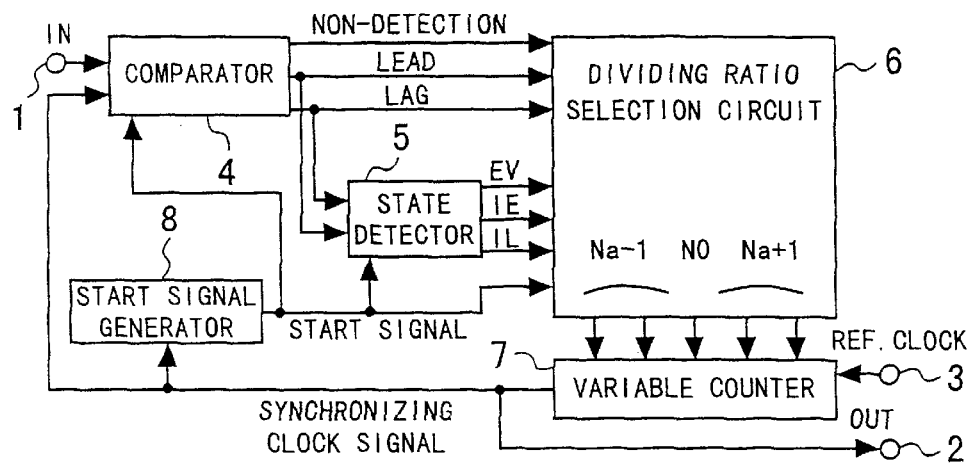
FIG. 2
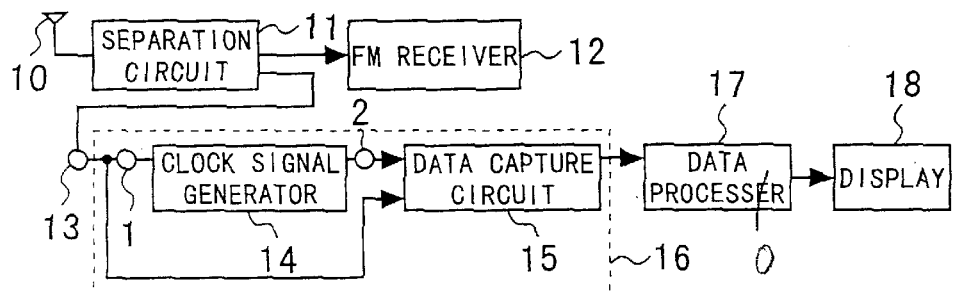
FIG. 3
| | SYNCHRONIZING CLOCK SIGNAL | | OUTPUT | | |
|---|---|---|---|---|---|
| | UPON L | UPON H | LEAD E | LAG L | NON-DETECTION |
| CASE1 | PRESENCE OF INPUT DATA EDGE | ABSENCE OF INPUT DATA EDGE | 1 | 0 | 0 |
| CASE2 | ABSENCE OF INPUT DATA EDGE | PRESENCE OF INPUT DATA EDGE | 0 | 1 | 0 |
| CASE3 | ABSENCE OF INPUT DATA EDGE | ABSENCE OF INPUT DATA EDGE | 0 | 0 | 1 |
| CASE4 | PRESENCE OF INPUT DATA EDGE | PRESENCE OF INPUT DATA EDGE | 0 | 0 | 1 |

FIG. 6
| RELATIONSHIP BETWEEN NE AND NL | OUTPUT | | |
|---|---|---|---|
| | IE:LEADS IS LARGER | IL:LAG IS LARGER | EV:LEADS= LAGS |
| NE>NL | 1 | 0 | 0 |
| NE<NL | 0 | 1 | 0 |
| NE=NL | 0 | 0 | 1 |
FIG. 7
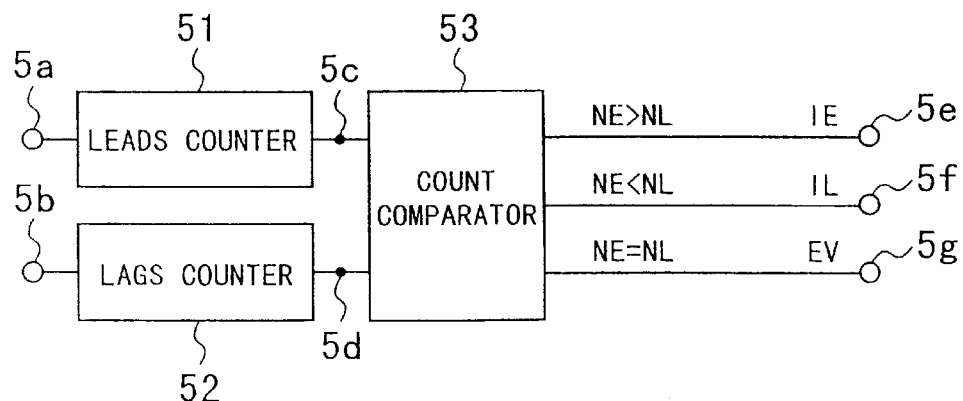
FIG. 8
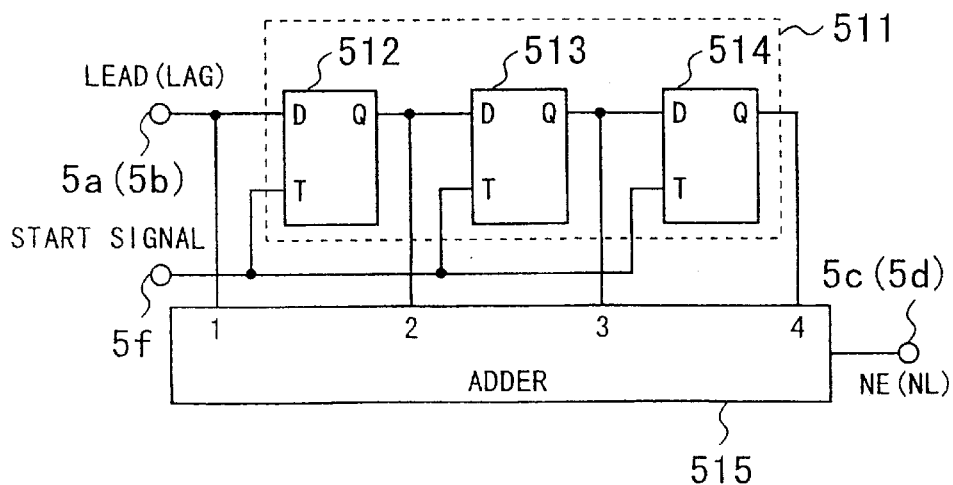

| | | | DIVIDING RATIO |
|---|---|---|---|
| LEAD+IE | DECREASE DIVIDING RATIO | SECOND TIME OR LATER | 448 |
| | | FIRST TIME | 449 |
| LAG+IL | INCREASE DIVIDING RATIO | FIRST TIME | 451 |
| | | SECOND TIME OR LATER | 452 |
| OTHER THAN ABOVE | REF. DIVIDING RATIO | | 450 |

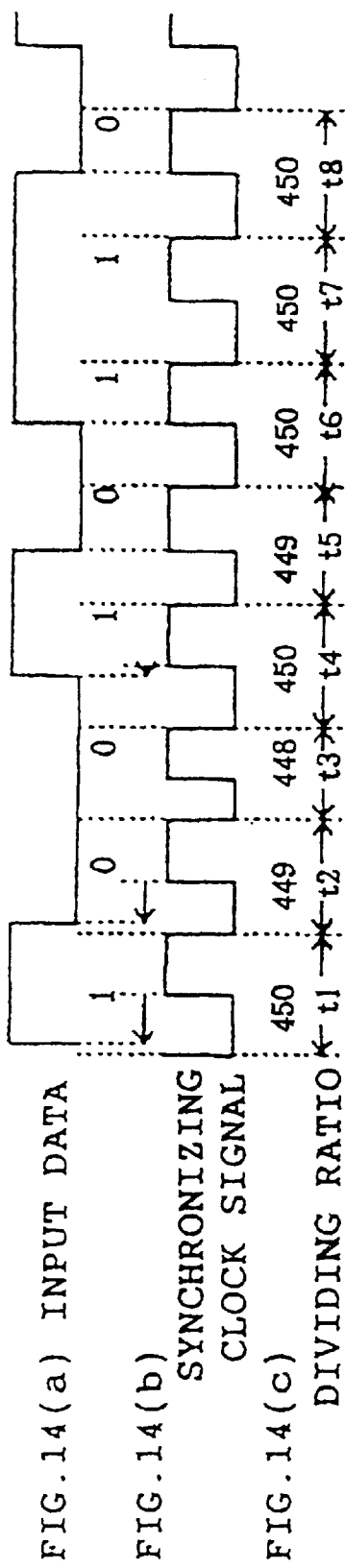
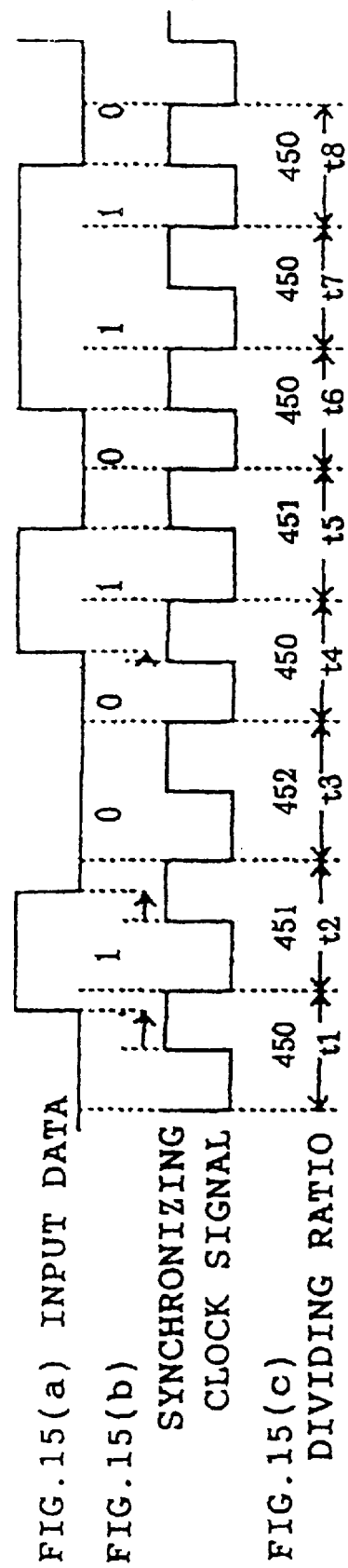

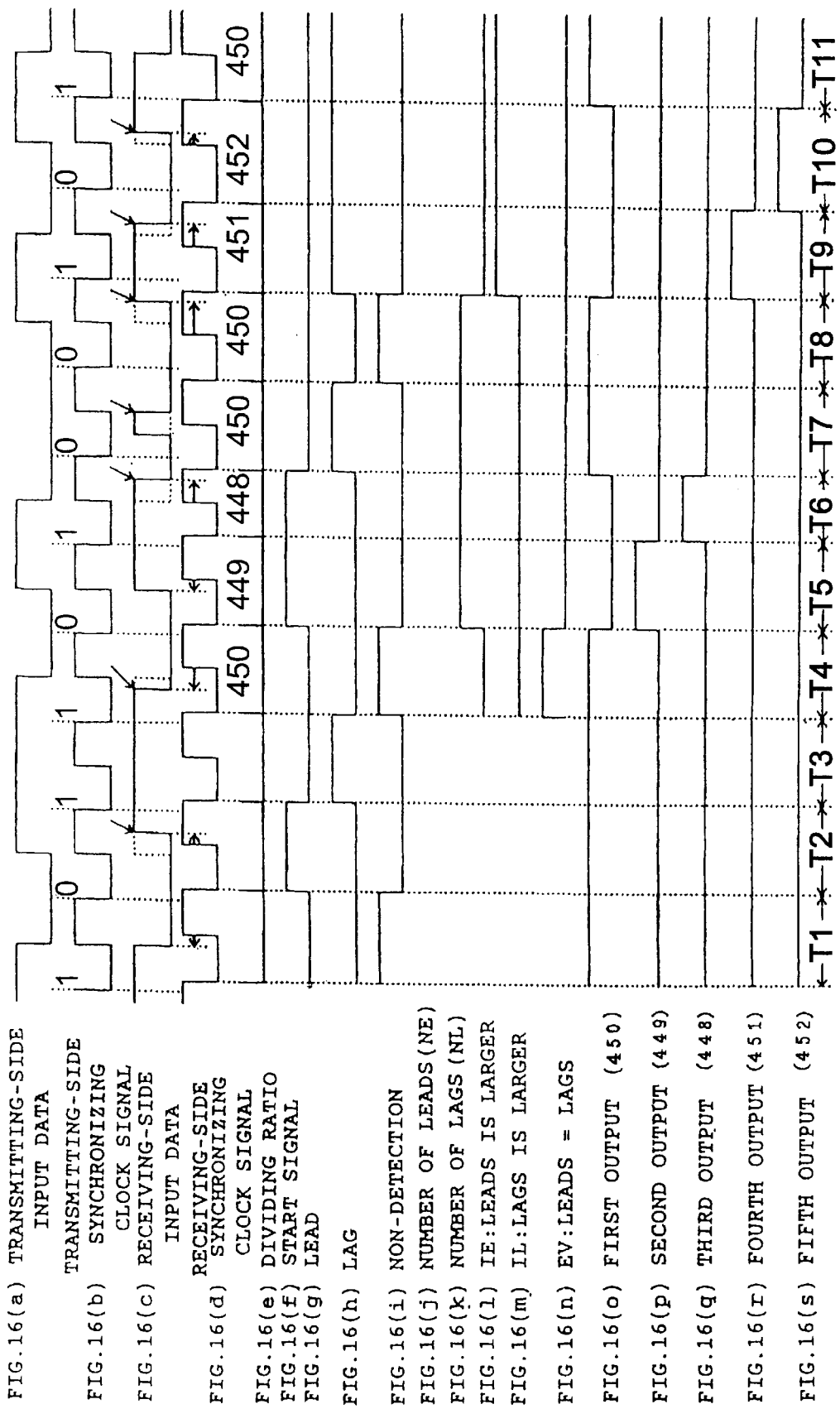

CLOCK SIGNAL GENERATOR AND DATA SIGNAL GENERATOR

BACKGROUND OF THE INVENTION

1. Field of the Invention

The present invention relates to a clock signal generator such as a PLL (Phase Locked Loop) circuit for outputting a synchronizing clock signal synchronized with input data comprising a digital signal, and to a data signal generator including the clock signal generator, for generating a digital signal based on input data and synchronizing with a clock signal.

2. Description of the Prior Art

A clock signal generator for outputting a synchronizing clock signal synchronized with input data has been disclosed in Japanese Patent Application Laid-Open No. 6-326599.

Japanese Patent Application Laid-Open No. 6-326599 shows a random walk filter having a phase comparator and a variable dividing ratio counter as the prior art example. The phase comparator of the random walk filter compares the phase of the edge of the input data and the phase of a reproduced clock pulse (synchronizing clock signal). The phase comparator outputs a lead signal when the reproduced clock pulse leads the input data, an equiphase signal when the reproduced clock pulse is equal to the input data, an d a lag signal when the reproduced clock pulse lags behind the input data.

Further, the variable dividing ratio counter divides the frequency of the clock pulse by a dividing ratio K when the counter has received the equiphase signal from the phase comparator to output a reproduced clock pulse. The variable dividing ratio counter divides the frequency of the clock pulse by a dividing ratio K+1 to output a reproduced clock pulse when receiving the lead signal from the phase comparator. The variable dividing ratio counter divides the frequency of the clock pulse by a dividing ratio K−1 to output a reproduced clock pulse when receiving the lag signal from the phase comparator.

Japanese Patent Application Laid-Open No. 6-326599 also discloses a clock signal generator in which even if the speed of received data varies, a shift-reduced clock can be reproduced. The clock signal generator is a clock pulse reproduction circuit having a phase comparator, a variable dividing ratio counter, a first counter, a second counter, a comparing means and a dividing ratio changing means. The first counter of the clock pulse reproduction circuit counts the number of times that the phase comparator outputs a lead signal within a predetermined period. The second counter counts the number of times that the phase comparator outputs a lag signal within the predetermined period. The comparing means compares the count value of the first counter and that of the second counter. The dividing ratio changing means varies the dividing ratio of the variable dividing ratio counter in accordance with the result of the comparison by the comparing means.

Recently, a transmitted FM-multiplexed signal has been obtained by superimposing a digital signal comprising character information on an FM sound signal. Receivers receiving the FM-multiplexed signal can recover the character information as well as enjoy the FM sound, displaying the character information on a character information display panel.

The digital signal superimposed on the FM sound signal, which is made up of the character information, is transferred at a predetermined transfer rate, normally, 16 kHz. However, the influence of noise and a change in the receiving state deteriorate the signal in S/N ratio and in phase stability. Because of the superimposition of noise, the digital signal input to the receiving side varies in phase, producing error data and the loss of data. Thus, the transfer rate of the digital signal is not necessarily set to the predetermined transfer rate in every data.

When the clock signal generator described as the first prior art captures the digital signal having a poor S/N ratio as the input data and produces the synchronizing clock signal (reproduced clock pulse) based on the input data, the following problems have arisen.

Where the phase of the input data is unstable, the dividing ratio output from the dividing ratio counter takes any of K, K−1 and K+1. As a result, the phase of the synchronizing clock signal often changes, producing an unstable state. At worst, the unstable state makes it difficult to synchronize the input data with the synchronizing clock signal.

Meanwhile, the clock signal generator described as the second prior art is considered to be effective for producing a regular phase shift to some extent, as in the case where the input data is fast or slow in speed. However, the generator has difficulty in synchronizing the input data with the synchronizing clock signal when a digital signal having a low S/N ratio is captured as the input data.

SUMMARY OF THE INVENTION

It is a general object of the present invention to provide a novel and useful clock signal generator.

A more specific object of the present invention is to provide a clock signal generator generating a synchronizing clock signal synchronized in phase with input data even when a poor digital signal, i.e., unstable in S/N ratio is captured as the input data.

A second object of the present invention to provide a data signal generator generating a synchronizing clock signal with a phase synchronized with the phase of input data even when an unstable digital signal is captured as the input data, thereby producing a digital signal based on the input data with high reliability.

The above object of the present invention is achieved by a clock signal generator. The clock signal generator includes a comparator. The comparator compares phases of an input data comprising a digital signal and a synchronizing clock signal, and outputting a comparison result signal indicative of any of a "lead", a "lag" and a "non-detection" of the input data with respect to the synchronizing clock signal for each data cycle. The clock signal generator includes a state detector circuit. The state detector circuit detects the numbers of "leads" and "lags" in the comparison result signals during a period comprising a plurality of continuous data cycles, and outputting a state detected signal indicative of any of "the number of leads is larger", "the number of lags is larger" and "the number of leads is equal to the number of lags". The clock signal generator also includes a dividing ratio selection circuit. The dividing ratio selection circuit outputs a dividing ratio signal indicative of a "dividing ratio smaller than a reference dividing ratio" when the comparison result signal indicates the "lead" and the state detected signal indicates "the number of leads is larger", outputting a dividing ratio signal indicative of a "dividing ratio greater than the reference dividing ratio" when the comparison result signal indicates the "lag" and the state detected signal indicates "the number of lags is larger", and outputting a dividing ratio signal indicative of the "reference dividing ratio" when the input comparison result signal and the state detected signal are other than the above relationships. The clock signal generator further includes a variable dividing ratio counter. The variable counter divides a frequency of a reference clock signal with a dividing ratio based on the dividing ratio signal, and outputting the result of division to the comparator as a synchronizing clock signal.

The above object of the present invention is also achieved by a clock signal generator. The clock signal generator includes a comparator. The comparator outputs a comparison result signal indicating a "lead" when an edge of an input data is detected upon one of an "H" level and an "L" level of an synchronizing clock signal and undetected upon the other level of the synchronizing clock signal in each data cycle, outputting a comparison result signal indicative of a "lag" when the edge of the input data is undetected upon the one level of the synchronizing clock signal and detected upon the other level of the synchronizing clock signal in each data cycle, and outputting a comparison result signal indicative of a "non-detection" when the synchronizing clock signal and the input data are other than the relationships. The clock signal generator includes a state detector circuit. The state detector circuit outputs a state detected signal indicative of "the number of leads is larger" when the number indicative of the "lead" is greater than the number indicative of the "lag" in the input comparison result signals during a predetermined period comprising a plurality of continuous data cycles, outputting a state detected signal indicative of "the number of lags is larger" when the number indicative of the "lag" is greater than the number indicative of the "lead" in the input comparison result signals during the period, and outputting a state detected signal indicative of "the number of leads is equal to the number of lags" when the number indicative of the "lead" is identical to the number indicative of the "lag" in the input comparison result signals during the predetermined period. The clock signal generator also includes a dividing ratio selection circuit. The dividing ratio selection circuit outputs a dividing ratio signal indicative of a "dividing ratio smaller than a reference dividing ratio" when the comparison result signal indicates the "lead" and the state detected signal indicates "the number of leads being larger", outputting a dividing ratio signal indicative of a "dividing ratio greater than the reference dividing ratio" when the input comparison result signal indicates the "lag" and the input state detected signal indicates "the number of lags is larger", and outputting a dividing ratio signal indicative of the "reference dividing ratio" when the input comparison result signal and the input state detected signal are other than the relationships. The clock signal generator further includes a variable dividing ratio counter. The variable dividing ratio counter divides a frequency of a reference clock signal with a dividing ratio based on the dividing ratio signal, and outputting the result of division to the comparator as a synchronizing clock signal.

The above object of the present invention is further achieved by a data signal generator. The data signal generator includes a clock signal generator for receiving input data comprised of a digital signal and a reference clock signal therein and generating a synchronizing clock signal synchronized with the digital signal. The data signal generator also includes a data capture circuit for detecting the level of the input data at one of the down edge and the up edge of the synchronizing clock signal, and outputting the result of detection as input data having a digital value based on the detected level. The clock signal generator includes a comparator. The comparator outputs a comparison result signal indicative of any of a "lead", a "lag" and a "non-detection" of the edge of the input data input for each data cycle with respect to the other of the down edge and the up edge of the synchronizing clock signal. The clock signal generator includes a state detector circuit. The state detector circuit detects the numbers of "leads" and "lags" in the input comparison result signals during a period comprising a plurality of continuous data cycles, and outputting a state detected signal indicative of any of "the number of leads being larger", "the number-of lags is larger " and "the number of leads is equal to the number of lags". The clock signal generator also includes a dividing ratio selection circuit. The dividing ratio selection circuit outputs a dividing ratio signal indicative of any of a "dividing ratio smaller than a reference dividing ratio", a "dividing ratio greater than the reference dividing ratio", and the "reference dividing ratio", based on the comparison result signals output by the comparator and the state detected signals output by the detector circuit. The clock signal generator further includes a variable dividing ratio counter for dividing the frequency of the reference clock signal with a dividing ratio based on the dividing ratio signal output by the dividing ratio selection circuit and outputting the result of division to the comparator and the data capture circuit as a synchronizing clock signal.

Other objects and further features of the present invention will be apparent from the following detailed description when read in conjunction with the accompanying drawings.

BRIEF DESCRIPTION OF THE DRAWINGS

FIG. 1 is a block diagram showing a clock signal generator according to a first embodiment of the present invention;

FIG. 2 is a block diagram of a character information display showing an example in which the clock signal generator shown in FIG. 1 is applied to a data signal generator;

FIG. 3 is a diagram for describing the relationship between the input and output of a comparator employed in the clock signal generator shown in FIG. 1;

FIG. 6 is a diagram for describing the relationship between the input and output of a state detector circuit employed in the clock signal generator shown in FIG. 1;

FIG. 7 is a block diagram showing the state detector circuit employed in the clock signal generator shown in FIG. 1;

FIG. 8 is a block diagram illustrating a lead number counter and a lag number counter employed in the state detector circuit shown in FIG. 7;

FIGS. 14(a) through 14(c) are timing charts for describing a situation where an input data leads a synchronizing clock signal;

FIGS. 15(a) through 15(c) are timing charts for describing a situation where an input data lags behind the synchronizing clock signal; and FIGS. 16(a) through 16(s) are waveform diagrams showing waveforms of signals at respective portions, for describing the operation of the clock signal generator shown in FIG. 1.

DESCRIPTION OF THE PREFERRED EMBODIMENTS

Figure 4:
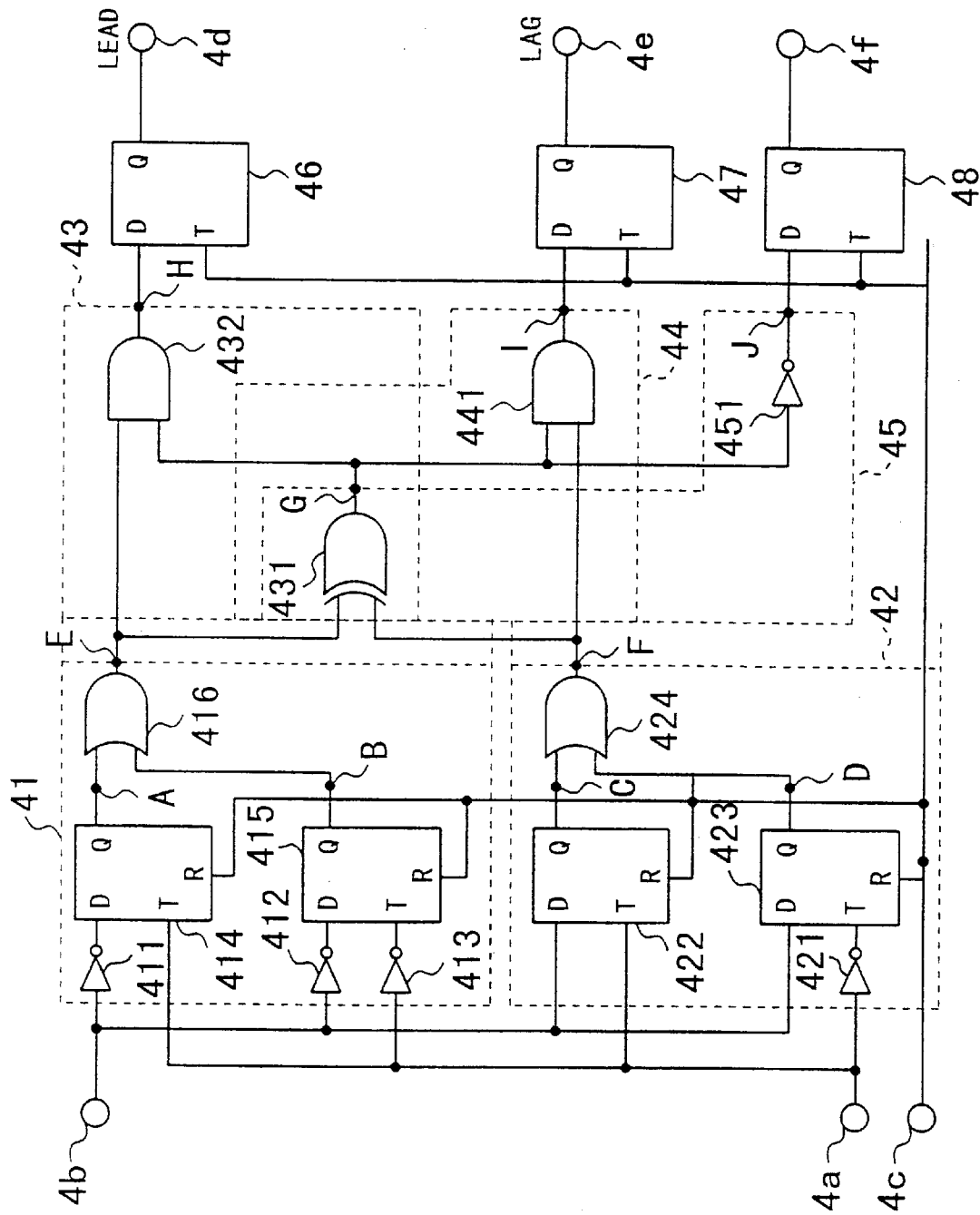
FIG. 4 is a circuit diagram illustrating the comparator employed in the clock signal generator shown in FIG. 1.
Figure 5:
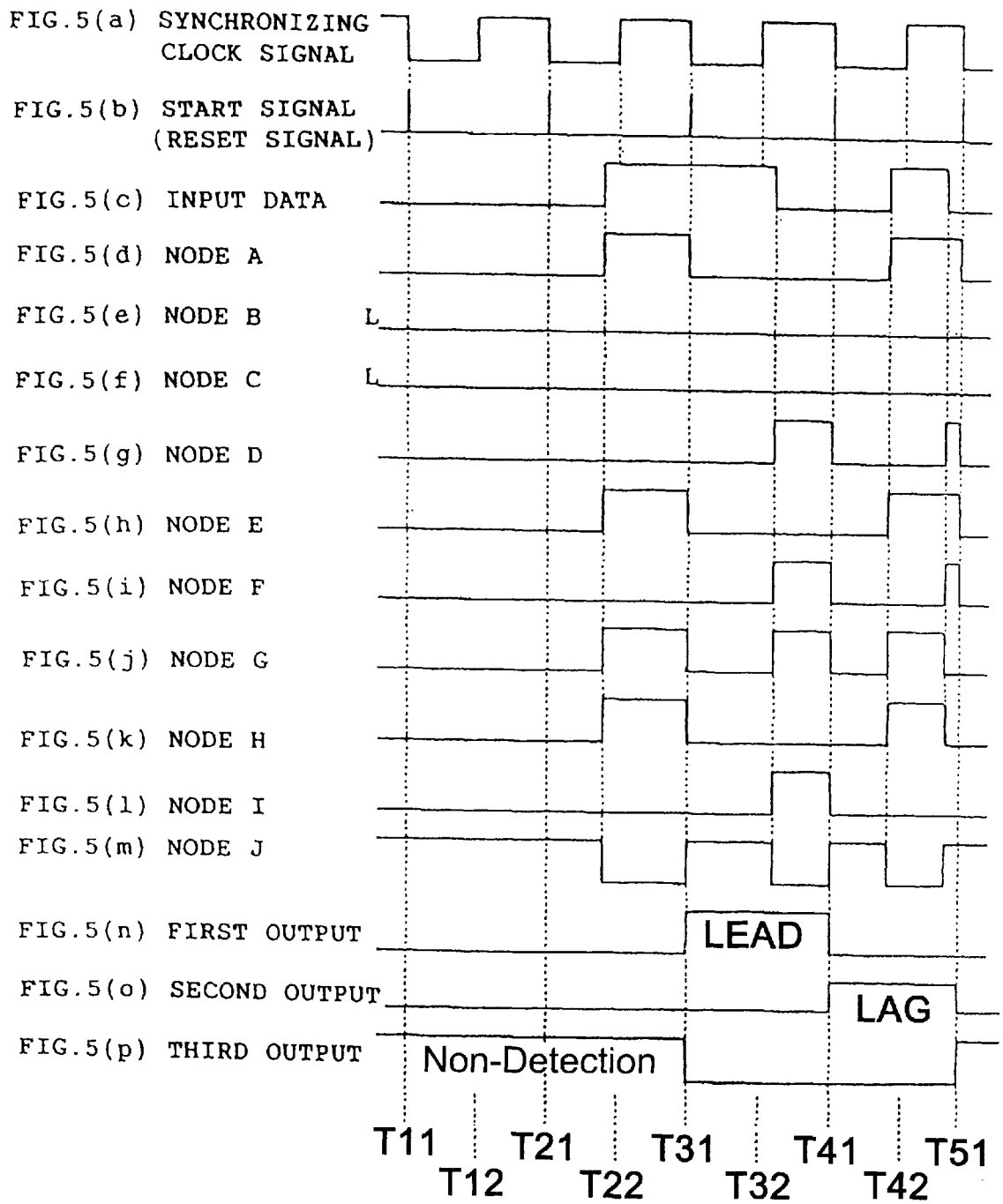
FIGS. 5(a) through 5(p) are waveform diagrams showing waveforms of signals at respective nodes of the comparator shown in FIG. 4.
Figure 9:
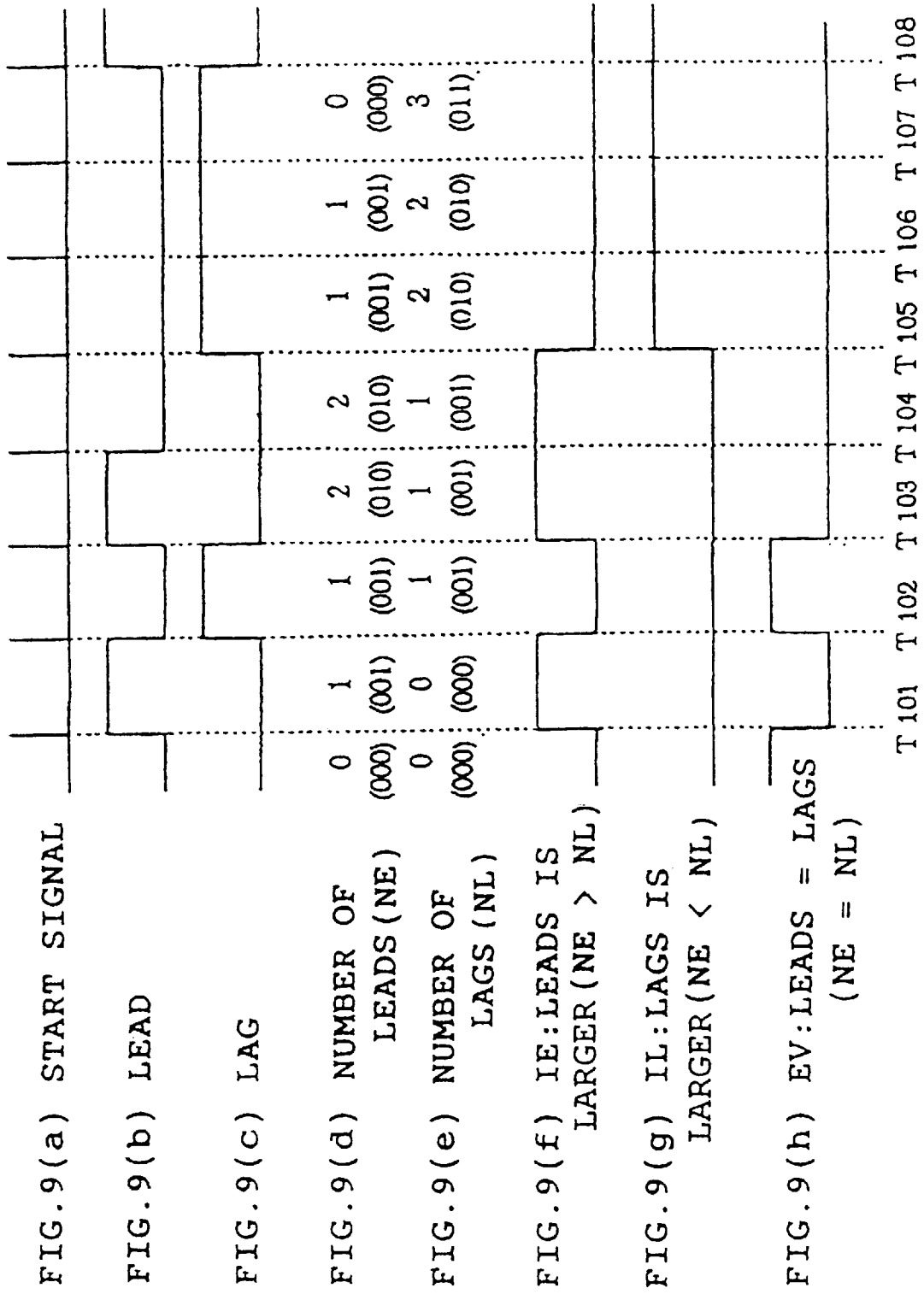
FIGS. 9(a) through 9(h) are waveform diagrams showing waveforms of signals at respective nodes of the state detector circuit shown in FIG. 7.

In the following, principles and embodiments of the present invention will be described with reference to the accompanying drawings.

First Embodiment

A first embodiment of the present invention will be described with reference to FIGS. 1 through 13. FIG. 1 shows a block diagram of a clock signal generator of the present embodiment. The clock signal generator has a data input terminal 1 as shown in FIG. 1. The data input terminal 1 is a terminal for inputting a digital signal comprising character information superimposed on an FM sound signal. In this embodiment, the digital signal has a transfer rate of 16 kHz and is transferred at 1/16000 second per data cycle. Thus, one data cycle corresponds to 1/16000 second.

The clock signal generator shown in FIG. 1 has an output terminal 2. The output terminal 2 is a terminal for outputting a synchronizing clock signal synchronized with the input data. In this embodiment, 16 kHz frequency, i.e., the same frequency as the transfer frequency mentioned above is used as a base frequency of the synchronizing clock signal. The clock signal generator has a reference clock input terminal 3. The reference clock terminal 3 is a terminal for inputting a reference clock signal for generating the synchronizing clock signal. The frequency of the reference clock signal is 7.2 MHz in this embodiment.

The data input terminal 1 and the output terminal 2 are connected to a comparator 4. An input data is supplied to the comparator 4 through the input terminal 1. The synchronizing clock signal output to the output terminal 2 is also supplied to the comparator 4. The comparator 4 compares the phase of the input data and that of the synchronizing clock signal, outputting a comparison result signal indicating any of a "lead" state, a "lag" state and a "non-detection" state for each data cycle (corresponding to 1/16000 second in the first embodiment). In this embodiment, in the "lead" state, the phase of the input data leads that of the synchronizing clock signal. The "lag" state represents a case in which the phase of the input data lags behind that of the synchronizing clock signal. Further, the "non-detection" state represents two cases below: one in which the relation between the phase of the input data and that of the synchronizing clock signal is uncertain and another in which the phase of the input data and that of the synchronizing clock signal are equal with each other.

FIG. 3 shows relationships between the input and the output of the comparator 4. In this embodiment, the comparator 4 outputs a comparison result signal indicating the "lead" state when conditions of a case 1 shown in FIG. 1 are satisfied. The case 1 includes two conditions as below.

(1) An up edge or a down edge of the input data being detected while the synchronized clock signal maintains an "H" level or an "L" level—in this embodiment, while the synchronized clock signal maintains an "L" level—during one data cycle. Namely, the up edge or the down edge of the input data is detected prior to an up edge or a down edge of the synchronized clock signal.

(2) Neither the up edge nor the down edge of the input data being detected while the synchronized clock signal maintains the other level—in this embodiment, while the synchronized clock signal maintains an "H" level—during one data cycle. Namely, neither the up edge nor the down edge of the input data is detected after either the up edge or the down edge of the synchronized clock signal.

In a case where both of the aforementioned conditions are satisfied, the comparator 4 outputs a 3-bit parallel signal of [1, 0, 0], indicating the "lead" state.

Further, the comparator 4 outputs a comparison result signal representing the "lag" state when detecting no edge of the input data during one level of the synchronizing clock signal and detecting the edge of the input data during the other level of the synchronizing clock signal in one data cycle (case 2). In this case, the comparator 4 outputs a 3-bit parallel signal of [0, 1, 0], indicating the "lag" state.

Moreover, the comparator 4 outputs a comparison result signal representing the "non-detection" state when the relationship between the synchronizing clock signal and the input data signal in one data cycle is other than the above relationships (case 3 and 4). In this case, the comparator 4 outputs a 3-bit parallel signal of [0, 0, 1], indicating the "non-detection" state.

FIG. 4 shows one example of a specific configuration of the comparator 4. As shown in FIG. 4, the comparator 4 includes a lead-presence detector circuit 41. The circuit 41 is connected to a data input node 4a which is connected to the input terminal 1. The circuit 41 receives the input data through the data input node 4a. The circuit 41 is also connected to a synchronizing signal input node 4b and a start signal input node 4c. The circuit 41 receives the synchronizing clock signal and a start signal through the input nodes 4b and 4c. The lead-presence detector circuit 41 outputs a signal indicating the "lead" state to a node E when the up edge or down edge of the input data is detected prior to either the up edge or the down edge of the synchronizing clock signal in one data cycle.

The lead-presence detector circuit 41 comprises first to third inverters 411 through 413, first and second flip-flop circuits 414 and 416 and a first arithmetic circuit 416. The first and second inverters 411 and 412 respectively comprise inverter elements electrically connected to the synchronizing clock signal input node 4b. Although the first and second inverters 411 and 412 are separately configured in the first embodiment, one inverter element may be used for the first and second inverters 411 and 412. The third inverter 413 comprises an inverter element electrically connected to the data input node 4a.

The first flip-flop circuit 414 includes a D-type flip-flop. The flip-flop circuit 414 receives the inverse of the synchronizing clock signal at a data input node D through the inverter 411, and receives the input data at a clock input node T through the data input node 4a. Further, the flip-flop circuit 414 receives the start signal at a reset node R through the start signal input node 4c, and is reset by an up edge of the start signal. In this embodiment, the output signal from an output node Q of the first flip-flop circuit 414 is brought to an "L" level by the resetting of the circuit 414. The flip-flop circuit 414 captures and outputs the level of the inverse of the synchronizing clock signal when an up edge of the input data is detected. For example, the first flip-flop circuit 414 outputs a signal shown in FIG. 5(d)—which corresponds to a signal at a node A—when a synchronizing clock signal, a start signal and input data respectively shown in FIGS. 5(a), 5(b) and 5(c) are input.

The second flip-flop circuit 415 comprises a D-type flip-flop. The flip-flop circuit 415 receives the inverse of the synchronizing clock signal at a data input node D through the inverter 412, and receives the inverse of the input data at a clock input node T through the inverter 413. Further, the flip-flop circuit 414 receives the start signal at a reset node R through the start signal input node 4c, and is reset by an up edge of the start signal. In this embodiment, the output signal from an output node Q of the second flip-flop circuit 415 is brought to an "L" level by the reset of the circuit 415. The flip-flop circuit 415 captures and outputs the level of the inverse of the synchronizing clock signal when an up edge of the inverse of the input data is detected. For example, the second flip-flop circuit 415 outputs a signal shown in FIG. 5(e)—which corresponds to a signal at a node B—when a synchronizing clock signal, a start signal and input data respectively shown in FIGS. 5(a), 5(b) and 5(c) are input. The first arithmetic circuit 416 comprises an OR circuit for logically adding the outputs of the first and second flip-flop circuits 414 and 415. For example, the first arithmetic circuit 416 outputs a signal shown in FIG. 5(h)—which corresponds to a signal at a node E—when the signals shown in FIGS. 5(d) and 5(e)—which are produced by the first and second flip-flop circuits 414 and 415, respectively,—are input. With respect to the output produced by the first arithmetic circuit 416, an "H" level is a signal indicative of the "presence of lead" and an "L" level is a signal indicative of the "absence of lead".

As shown in FIG. 4, the comparator 4 includes a lag-presence detector circuit 42. The circuit 42 is connected to a data input node 4a which is connected to the input terminal 1. The circuit 42 receives the input data through the data input node 4a. The circuit 42 is also connected to a synchronizing signal input node 4b and a start signal input node 4c. The circuit 42 receives the synchronizing clock signal and a start signal through the input nodes 4b and 4c. The lag-presence detector circuit 42 outputs a signal indicating the "lag" state to a node F when the up edge or down edge of the input data is detected after either the up edge or the down edge of the synchronizing clock signal in one data cycle.

As shown in FIG. 4, the comparator 4 includes a lag-presence detector circuit 42. The circuit 42 receives the input data through the data input node 4a that is connected to the input terminal 1. The circuit 41 receives the input data through the data input node 4a. The circuit 41 receives the synchronizing clock signal and a start signal through the synchronizing signal clock input node 4b and the start signal input node 4c, respectively. The lag-presence detector circuit 42 outputs a signal indicating the "lead" state when the up edge or down edge of the input data is detected after either the up edge or the down edge of the synchronizing clock signal in one data cycle.

The lag-presence detector circuit 42 comprises a fourth inverter 422, third and fourth flip-flop circuits 422 and 423 and a second arithmetic circuit 424. The fourth inverter 421 is made up of an inverter element electrically connected to the data input node 4a. Although the fourth inverter 421 is different in configuration from the third inverter 413 in the first embodiment, the third inverter 413 may be used for the fourth inverter 421.

The third flip-flop circuit 422 is made up of a D-type flip-flop. The flip-flop circuit 422 receives the synchronizing clock signal at a data input node D through the synchronizing clock signal input node 4b, and receives the input data at a clock input node T through the data input node 4a. Further, the flip-flop circuit 422 receives the start signal at a reset node R through the start signal input node 4c, and is reset by an up edge of the start signal. In this embodiment, the output signal from an output node Q of the third flip-flop circuit 422 is brought to an "L" level by the reset of the circuit 422. The flip-flop circuit 422 captures and outputs the level of the synchronizing clock signal when an up edge of the input data is detected. For example, the third flip-flop circuit 422 outputs a signal shown in FIG. 5(f)—which corresponds to a signal at a node C—when a synchronizing clock signal, a start signal and input data shown in FIGS. 5(a) through 5(c) are input.

The fourth flip-flop circuit 423 is made up of a D-type flip-flop. The flip-flop circuit 423 receives the synchronizing clock signal at a data input node D through the synchronizing clock signal input node 4b, and receives the inverse signal of the input data at a clock input node T through the inverter 421. Further, the flip-flop circuit 423 receives the start signal at a reset node R through the start signal input node 4c, and is reset by an up edge of the start signal. In this embodiment, the output signal from an output node Q of the fourth flip-flop circuit 423 is brought to an "L" level by the reset of the circuit 423. The flip-flop circuit 423 captures and outputs the level of the synchronizing clock signal when an up edge of the inverse signal of the input data is detected. For example, the fourth flip-flop circuit 423 outputs a signal shown in FIG. 5(g)—which corresponds to a signal at a node D—when a synchronizing clock signal, a start signal and input data shown in FIGS. 5(a) through 5(c) are input.

The second arithmetic circuit 424 comprises an OR circuit for logically adding the outputs of the third and fourth flip-flop circuits 422 and 423. For example, the second arithmetic circuit 424 outputs a signal shown in FIG. 5(i)—which corresponds to a signal at a node F—when the signals shown in FIGS. 5(f) and 5(g)—which are produced by the third and fourth flip-flop circuits 422 and 423, respectively,—are inputted. With respect to the output produced by the second arithmetic circuit 423, an "H" level is a signal indicative of the "presence of lead" and an "L" level is a signal indicative of the "absence of lead".

As shown in FIG. 4, the comparator 4 includes a lead detector circuit 43. The circuit 43 receives outputs of the lead-presence detector circuit 41 and the lag-presence detector circuit 42, outputting a comparison result signal indicative of the "lead" when the output of the lead-presence detector circuit 41 indicates the "presence of lead" and the output of the lag-presence detector circuit 42 indicates the "absence of lag".

The lead detector circuit 43 comprises a third arithmetic circuit 431 and a fourth arithmetic circuit 432. The third arithmetic circuit 431 is made up of an Exclusive OR circuit for performing an Exclusive OR operation based on the outputs of the first arithmetic circuit 416 of the lead-presence detector circuit 41 and the second arithmetic circuit 424 of the lag-presence detector circuit 42. The fourth arithmetic circuit 432 is made up of an AND circuit for performing an AND operation based on the outputs of the first arithmetic circuit 416 and the third arithmetic circuit 431. For example, the third arithmetic circuit 431 outputs a signal shown in FIG. 5(j)—which corresponds to a signal at a node G—when the outputs of the first and second arithmetic circuits 416 and 424 shown in FIGS. 5(h) and 5(i), respectively, are inputted to the lead detector circuit 43. Further, the fourth arithmetic circuit 432 outputs a signal shown in FIG. 5(k)—which corresponds to a signal at node H—in the same condition. The output of the fourth arithmetic circuit 432 is the comparison result signal of the lead detector circuit 43. In this embodiment, with respect to the comparison result signal, an "H" level indicates the "lead" state.

As shown in FIG. 4, the comparator 4 includes a lag detector circuit 44. The circuit 44 receives outputs of the lead-presence detector circuit 41 and the lag-presence detector circuit 42, outputting a comparison result signal indicative of the "lag" when the output of the lead-presence detector circuit 41 indicates the "absence of lead" and the output of the lag-presence detector circuit 42 indicates the "presence of "lag".

The lag detector circuit 44 comprises the third arithmetic circuit 431 and a fifth arithmetic circuit 441. The fifth arithmetic circuit 441 is made up of an AND circuit for performing an AND operation based on the outputs of the second arithmetic circuit 424 and the third arithmetic circuit 431. For example, the fifth arithmetic circuit 441 outputs a signal shown in FIG. 5(l)—which corresponds to a signal at a node I—when the outputs of the first and second arithmetic circuits 416 and 424 shown in FIGS. 5(h) and 5(i), respectively, are inputted. The output of the fifth arithmetic circuit 441 is the comparison result signal of the lag detector circuit 44. In this embodiment, with respect to the comparison result signal, an "H" level indicates the "lag" state.

As shown in FIG. 4, the comparator 4 includes a non-detection detector circuit 45. The circuit 45 receives outputs of the lead-presence detector circuit 41 and the lag-presence detector circuit 42. The circuit 45 outputs a comparison result signal indicative of the "non-detection" when the output of the lead-presence detector circuit 41 indicates the "presence of lead" and the output of the lag-presence detector circuit 42 indicates the "presence of lag" and when the output of the lead-presence detector circuit 41 indicates the "absence of lead" and the output of the lag-presence detector circuit 42 indicates the "absence of lag".

The non-detection detector circuit 45 comprises the third arithmetic circuit 431 and a fifth inverter 451. The fifth inverter 451 is made up of an inverter circuit that inverts the output of the third arithmetic circuit 431. For example, the fifth inverter circuit 451 outputs a signal shown in FIG. 5(m)—which corresponds to a signal at a node J—when the outputs of the first and second arithmetic circuits 416 and 424 shown in FIGS. 5(h) and 5(i), respectively, are inputted. The output of the fifth inverter circuit 451 is the comparison result signal of the non-detection detector circuit 45. In this embodiment, with respect to the comparison result signal, an "H" level indicates the "non-detection" state.

The converter 4 has a first timing adjusting circuit 46. The circuit 46 comprises a D-type flip-flop which receives the output of the lead detector circuit 43 at a data input node D and the start signal at a clock input node T through the start signal input node 4c. The circuit 46 captures the level of the output of the lead detector circuit 43, i.e., the comparison result signal of the lead detector circuit 43 when the up edge of the start signal is detected. Then, the circuit 46 outputs a signal to a first comparison result output node 4d through a data output node Q as a signal corresponding to a "lead" in the comparison result signal. For example, the first timing adjusting circuit 46 outputs a signal shown in FIG. 5(n)—hereinafter, it is referred to as a first comparison result output—when the start signal and the output of the lead detector circuit 43 shown in FIGS. 5(b) and 5(k), respectively, are inputted. In this embodiment, with respect to the first comparison result output, an "H" level indicates the "lead" state.

The converter 4 has a second timing adjusting circuit 47. The circuit 47 comprises a D-type flip-flop which receives the output of the lag detector circuit 44 at a data input node D and the start signal at a clock input node T through the start signal input node 4c. The circuit 47 captures the level of the output of the lag detector circuit 44, i.e., the comparison result signal of the lag detector circuit 44 when the up edge of the start signal is detected. Then, the circuit 47 outputs a signal to a second comparison result output node 4e through a data output node Q as a signal corresponding to a "lag" in the comparison result signal. For example, the second timing adjusting circuit 47 outputs a signal shown in FIG. 5(o)—hereinafter, it is referred to as a second comparison result output—when the start signal and the output of the lag detector circuit 44 shown in FIGS. 5(b) and 5(l), respectively, are inputted. In this embodiment, with respect to the second comparison result output, an "H" level indicates the "lag" state.

The converter 4 has a third timing adjusting circuit 48. The circuit 48 comprises a D-type flip-flop which receives the output of the non-detection detector circuit 45 at a data input node D and the start signal at a clock input node T through the start signal input node 4c. The circuit 48 captures the level of the output of the non-detection detector circuit 45, i.e., the comparison result signal of the non-detection detector circuit 45 when the up edge of the start signal is detected. Then, the circuit 48 outputs a signal to a third comparison result output node 4f through a data output node Q as a signal corresponding to a "non-detection" in the comparison result signal. For example, the third timing adjusting circuit 48 outputs a signal shown in FIG. 5(p)—hereinafter, it is referred to as a third comparison result output—when the start signal and the output of the non-detection detector circuit 45 shown in FIGS. 5(b) and 5(m), respectively, are inputted. In this embodiment, with respect to the third comparison result output, an "H" level indicates the "non-detection" state.

Referring back to FIG. 1, the clock signal generator of the present embodiment includes a state detector circuit 5. The circuit 5 comprises an integral phase detector circuit for receiving comparison result signals from the comparator 4, and producing a state detected signal based on the signals. More particularly, the integral phase detector detects the numbers of "leads" and "lags" in the comparison result signals inputted during a predetermined period comprised of a plurality of continuous data cycles, and outputting the state detected signal indicative of any of "IE state", "IL state" and "EV state". The IE state represents a state where the number of leads is larger. The IL state represents a state where the number of lags is larger. Further, the EV state represents a state where the number of leads equals to the number of lags.

In this embodiment, the state detection circuit 5 produces state detected signals based on the numbers NE and NL. The number NE represents a number of the lead in the comparison result signals inputted during the predetermined period comprised of the plurality of continuous data cycles (4 data cycles are illustrated for simplification of description in this embodiment and 16 data cycles are used in practice) The number NL represents a number of the lag in the comparison result signals during the same period.

As shown in FIG. 6, the state detection circuit 5 outputs a state detected signal indicative of the "IE state"—which is a 3-bit parallel signal of [1, 0, 0] in this embodiment—when "the number NE indicative of the lead" is greater than "the number NL indicative of the lag" (NE>NL). Further, the state detection circuit 5 outputs a state detected signal indicative of the "IL state"—which is a 3-bit parallel signal of [0, 1, 0] in this embodiment—when "the number NL" is greater than "the number NE" (NE<NL). Moreover, the state detector circuit 5 outputs a state detected signal indicative of "EV state" -which is a 3-bit parallel signal of [0, 0, 1] in this embodiment—when "the number NE" and "the number NL" are equal to each other (NE=NL).

FIG. 7 shows an example of a specific configuration of the state detector circuit 5. As shown in FIG. 7, the state detector circuit 5 includes a number-of-leads counter for counting a number of the "lead" based on the comparison result signal output by the comparator 4. That is, the number-of-leads counter 51 receives a comparison result signal corresponding to the "lead" from the comparator 4 via an input node 5a, counting a number that the comparison result signal is brought to an "H" level—which indicates the "lead"—for each data cycle during the predetermined period. The number-of-leads counter 51 is specifically made up of a circuit shown in FIG. 8.

As shown in FIG. 8, the number-of-leads counter 51 includes a shift register comprised of a plurality of cascade-connected D-type flip-flops 512 through 514. In this embodiment, the flip-flops are connected so as to form three stages because the predetermined period is set to the four data cycles. In the shift register 511, a data input node D of the first-stage flip-flop 512 is electrically connected to an input node 5a. Further, data input nodes D of the flip-flops 513 and 514 subsequent to the first stage are electrically connected to data output nodes Q of the pre-stage flip-flops 512 and 513, respectively. Moreover, clock input nodes T of the respective flip-flops 512 through 514 are electrically connected to a start signal input node to which a start signal is inputted.

The number-of-lead counter 51 includes an adder 515. The adder 515 receives signals at their input nodes from the input node 5a and the plurality of flip-flops 512 through 514 constituting the shift register 511. The adder 515 adds the values of signals received at these input nodes together, then outputting the result of the adding to a first addition-result output node 5c. Since the predetermined period is set to the four data cycles in this embodiment, the adder 515 outputs the result—which is obtained by adding the numbers of "H" levels in the signals inputted from the input node 5a and the plurality of flip-flops 512 through 514—as a 3-bit signal. For example, the adder 515 outputs a 3-bits signal shown in FIG. 9(d)—which corresponds to a "number NE indicative of a lead"—when a start signal shown in FIG. 9(a) and a comparison result signal shown in FIG. 9(b) which corresponds to the "lead" and is supplied from the comparator 4 are inputted.

As shown in FIG. 7, the state detector circuit 5 includes a number-of-lags counter 52 for counting a number of the "lag" based on the comparison result signal output by the comparator 4. That is, the number-of-lags counter 52 receives a comparison result signal corresponding to the "lag" from the comparator 4 via an input node 5b, counting a number that the comparison result signal is brought to an "H" level—which indicates the "lag"—for each data cycle during the predetermined period. The number-of-lags counter 52 is specifically made up of a circuit similar to the one shown in FIG. 8 in a manner similar to the number-of-leads counter 51. For example, the number-of-lags counter 52 outputs a 3-bits signal shown in FIG. 9(e)—which corresponds to a "number NL indicative of a lag"—to a second addition result output node 5d when a start signal shown in FIG. 9(a) and a comparison result signal shown in FIG. 9(c)—which corresponds to the "lag" and is supplied from the comparator 4—are inputted.

As shown in FIG. 7, the state detector circuit 5 includes a count comparator 53 for comparing count values of the number-of-leads counter 51 and the number-of-lags counter 52. In this embodiment, for example, the count comparator 53 outputs signals shown in FIGS. 9(f) through 9(h) from first through third result output nodes 5e through 5g when the count values shown in FIGS. 9(d) and 9(e), respectively, are output by the number-of-leads counter 51 and the number-of-lags counter 52.

The signal output by the first through third result output nodes 5e through 5g result in state detected signals. The state detected signal output by the first result output node 5e corresponds to the "IE state". That is, an "H" level of the signal output by the node 5e indicates that the "IE state" has been detected, i.e., the number of the "lead" has been grater than that of the "lag". The state detected signal output by the second result output node 5f corresponds to the "IL state". That is, an "H" level of the signal output by the node 5f indicates that the "IL state" has been detected, i.e., the number of the "lag" has been grater than that of the "lead". The state detected signal output by the third result output node 5g corresponds to the "EV state". That is, an "H" level of the signal output by the node 5g indicates that the "EV state" has been detected, i.e., the number of the "lead" has been equal to that of the "lag".

Referring again to FIG. 1, the clock signal generator of the present embodiment includes a dividing ratio selection circuit 6. The circuit 6 calculates a dividing ratio signal indicative of any of a "frequency-dividing ratio (Na−1) smaller than a reference dividing ratio N0", a "dividing ratio (Na+1) greater than the reference dividing ratio N0" and the "reference dividing ratio N0", based on comparison result signals output by the comparator 4 and state detected signals output by the state detector circuit 5, and outputting the dividing ratio signal.

The dividing ratio selection circuit 6 outputs a dividing ratio signal indicative of the "dividing ratio (Na−1) smaller than the reference dividing ratio N0", when the corresponding input comparison result signal indicates a "lead" and the corresponding input state detected signal indicates that "the number of leads is larger". The circuit 6 outputs a dividing ratio signal indicative of the "dividing ratio (Na+1) greater than the reference dividing ratio N0", when the input comparison result signal indicates a "lag" and the input state detected signal indicates that "the number of lags is larger". Further, the circuit 6 outputs a dividing ratio signal indicative of the "reference dividing ratio N0", when the input comparison result signal and the input state detected signal are other than the above relationships.

A dividing ratio Nn (in an "n"th data cycle) smaller than the reference dividing ratio, which is indicated by the dividing ratio signal output by the dividing ratio selection circuit 6, is equal to a value (N (n−1)−1) smaller than a dividing ratio N(n−1) indicated by a dividing ratio signal in a data cycle (in this case "a" being equivalent to an "n−1"th) immediately before the output of the dividing ratio Nn. A dividing ratio Nn greater than the reference dividing ratio indicated by the dividing ratio signal is equal to a value (N(n−1)+1) greater than the dividing ratio N(n−1) indicated by the dividing ratio signal in the data cycle immediately before the output of the dividing ratio Nn.

Figures 10, 11:
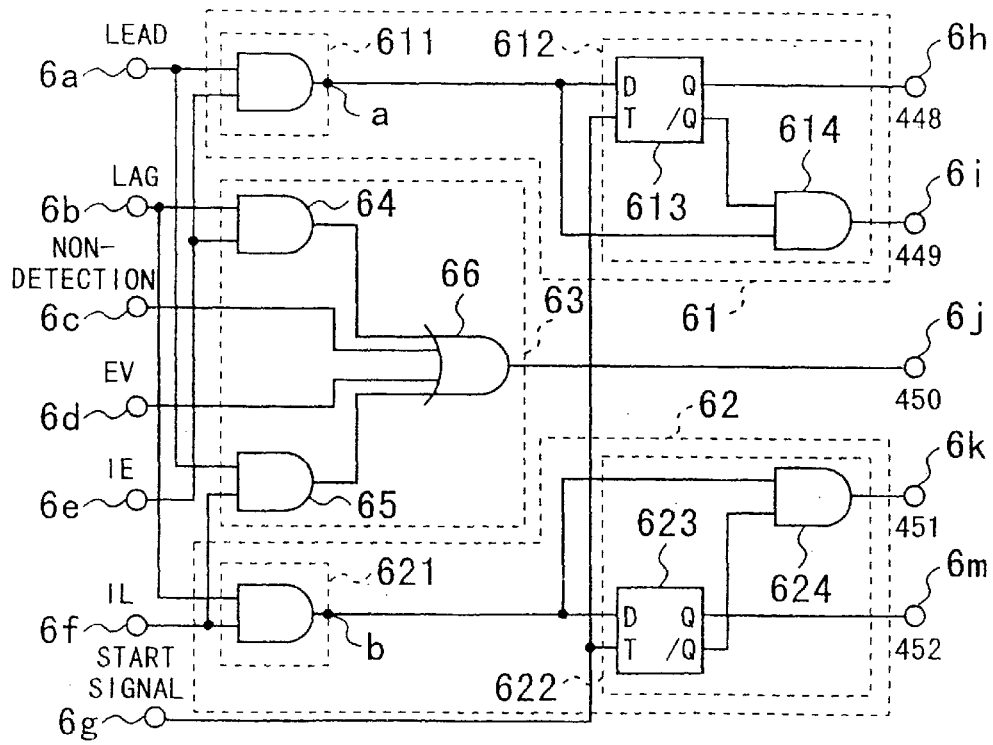
FIG. 10 is a diagram for describing the relationship between the input and output of a dividing ratio selection circuit employed in the clock signal generator shown in FIG. 1.
FIG. 11 is a circuit diagram illustrating the dividing ratio selection circuit employed in the clock signal generator shown in FIG. 1.

In this embodiment, the dividing ratio smaller than the reference dividing ratio and the dividing ratio greater than the reference dividing ratio are respectively classified into two as shown in FIG. 10.

Namely, when the comparison result signal indicates the "lead" and the state detected signal indicates that "the number of lead is larger", the dividing ratio is set to a dividing ratio reduced by 1 from the reference dividing ratio (corresponding to 450 in this embodiment). Further, when the comparison result signal indicates the "lead" and the state detected signal indicates that "the number of leads is larger" even in the case of the next data cycle, the dividing ratio is set to a dividing ratio (corresponding to 448 in this embodiment) further reduced by 1. Even when the comparison result signal indicates the "lead" and the state detected signal indicates that "the number of leads is larger" continuously after its setting, the dividing ratio (corresponding to 448 in this embodiment) set in the immediately preceding data cycle is maintained.

Further, when the comparison result signal indicates the "lag" and the input state detected signal indicates that "the number of lags is larger", the dividing ratio is set to a dividing ratio increased by 1 from the reference dividing ratio. Moreover, when the comparison result signal indicates the "lag" and the input state detected signal indicates that "the number of lags is larger" even in the case of the next data cycle, the dividing ratio is set to a dividing ratio (corresponding to 452 in this embodiment) further increased by 1. Even when the comparison result signal indicates the "lag" and the input state detected signal indicates that "the number of lags is larger" in succession after its setting, the dividing ratio (corresponding to 452 in this embodiment) set in the immediately preceding data cycle is maintained.

FIG. 11 shows one example of a specific configuration of the dividing ratio selection circuit 6 is shown in FIG. 11. As shown in FIG. 11, the dividing ratio selection circuit 6 includes a small dividing ratio generator 61. The generator 61 calculates a dividing ratio signal indicative of a "dividing ratio smaller than a reference dividing ratio", based on the comparison result signal output by the comparator 4 and the state detected signal output by the state detector circuit 5. The small dividing ratio generator 61 has a sixth arithmetic circuit 611 and a first shift register 612.

The sixth arithmetic circuit 611 comprises an AND circuit which receives signals through an input nodes 6a and 6e. A comparison result signal corresponding to the "lead" is output by the comparator 4 to the input node 6a. A state detected signal corresponding to "the number of leads being larger" is output by the state detector circuit 5 to the input node 6e. The sixth arithmetic circuit 611 performs an AND operation based on the comparison result signal and the state detected signal. For example, the sixth arithmetic circuit 611 outputs a signal shown in FIG. 12(*h*)—which corresponds to a signal at a node "a" shown in FIG. 11—when the comparison result signal and the state detected signal shown in FIG. 12(*b*) and 12(*e*), respectively, are inputted.

The first shift register 612 shifts the output of the sixth arithmetic circuit 611 and outputs the shifted results to output nodes 6h and 6i, when a start signal is inputted through an input node 6g. The first shift register 612 includes a D-type flip-flop circuit 613 and an AND circuit 614. The flip-flop circuit 613 receives the output of the sixth arithmetic circuit 611 at a data input node D thereof and accepts the start signal at a clock input node T thereof. Further, the flip-flop circuit 613 has an output node Q electrically connected to the output node 6h. The AND circuit 614 performs an AND operation based on the output of the sixth arithmetic circuit 611 and an output of an inverse output node/Q of the flip-flop circuit 613, then outputting the result of the operation to the output node 6i.

Figure 12:
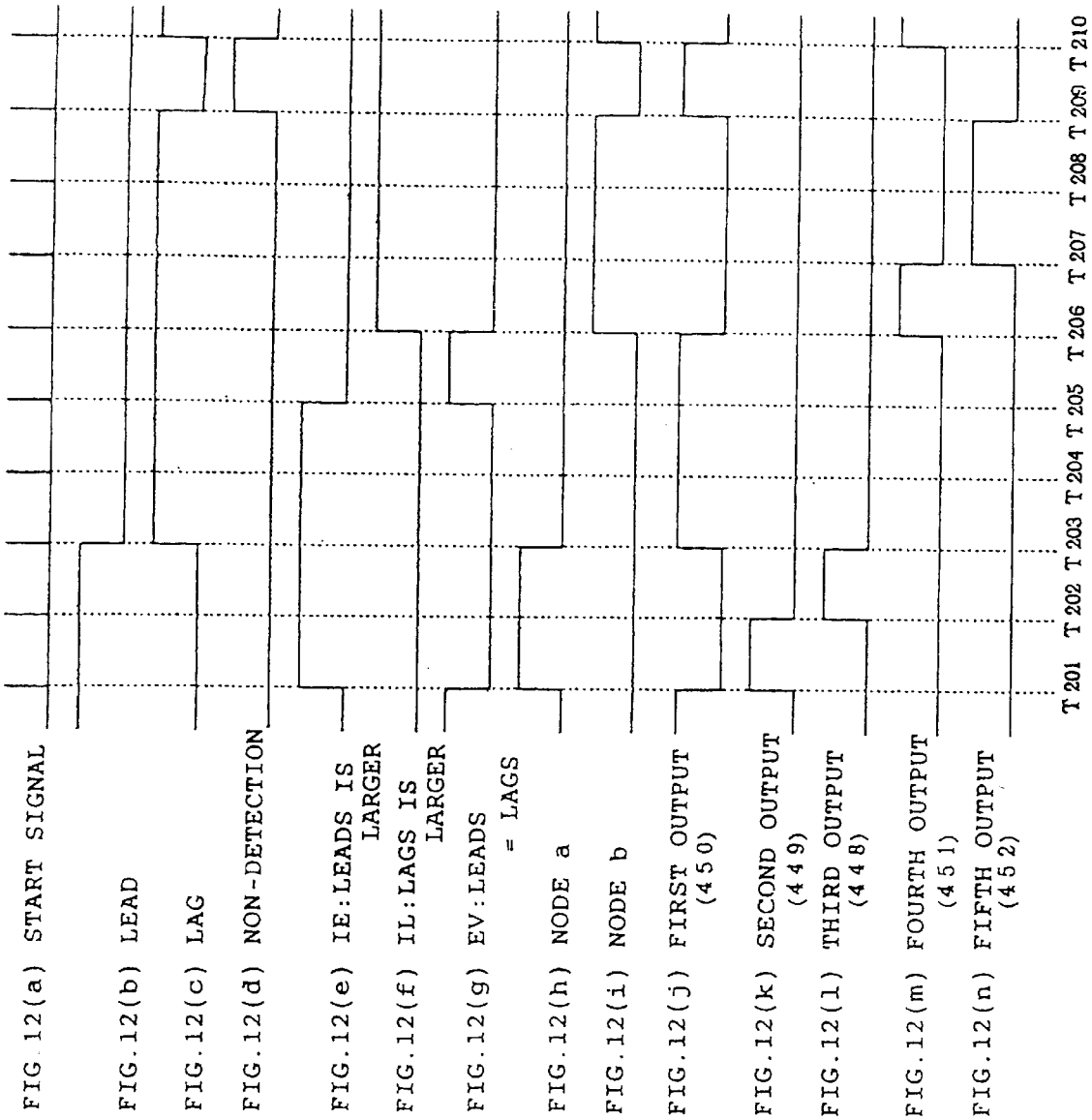
FIGS. 12(a) through 12(n) are waveform diagrams showing waveforms of signals at respective nodes of the dividing ratio selection circuit shown in FIG. 11.

For example, the first shift register 612 outputs the signal shown in FIG. 12(*l*) from the output node Q of the flip-flop circuit 613 to the output node 6h as a dividing ratio signal corresponding to a "dividing ratio smaller than the reference dividing ratio", when the start signal and the output of the sixth arithmetic circuit 611 shown in FIGS. 12(*a*) and 12(*h*), respectively, are inputted. Hereinafter, the output of the output node 6h is referred to as a third output. In this embodiment, the third output, i.e., the dividing ratio signal output by the output node 6h indicates that "the dividing ratio is smaller than the reference dividing ratio", specifically, "the dividing ratio is 448" when the level thereof is "H". Further, in the case mentioned above, a signal shown in FIG. 12(*k*) is output by the AND circuit 614 to the output node 6i as a dividing ratio signal corresponding to a "dividing ratio smaller than the reference dividing ratio". Hereinafter, the output of the output node 6i is referred to as a second output. In this embodiment, the second output, i.e., the dividing ratio signal output by the output node 6i indicates that "the dividing ratio is smaller than the reference dividing ratio", specifically, "the dividing ratio is 449" when the level thereof is "H".

Namely, when the comparison result signal indicates the "lead" and the state detected signal indicates that "the number of leads is larger", the small dividing ratio generator 61 outputs an "H" level signal from the output node 6i (at this time, an "L" level signal is output by the output node 6h). The "H" level signal indicates a dividing ratio (449) reduced by 1 from the reference dividing ratio (corresponding to 450 in this embodiment). Further, when the comparison result signal indicates the "lead" and the state detected signal indicates that "the number of leads is larger" even in the next data cycle, the small dividing ratio generator 61 outputs an "H" level signal from the output node 6h (at this time, an "L" level signal is output by the output node 6i). The signal output by the output node 6h indicates a dividing ratio (448) reduced by 1 from the dividing ratio in the previous data cycle. Even when the comparison result signal indicates the "lead" and the state detected signal indicates that "the number of leads is larger" continuously after the above process, the small dividing ratio generator 61 outputs an "H" level signal from the output node 6h (at this time, an "L" level signal is output by the output node 6i) so as to thereby indicate that the dividing ratio (448) in the previous data cycle should be kept.

As shown in FIG. 11, the dividing ratio selection circuit 6 includes a large dividing ratio generator 62. The generator 62 calculates a dividing ratio signal indicative of a "dividing ratio greater than the reference dividing ratio" based on the comparison result signal output by the comparator 4 and the state detected signal output by the state detector circuit 5, and outputting the calculated result. The large dividing ratio generator 62 has a seventh arithmetic circuit 621 and a second shift register 622.

The seventh arithmetic circuit 621 comprises an AND circuit. The AND circuit receives the comparison result signal corresponding to the "lag" from the comparator 4 through an input node 6b, also receives the state detected signal corresponding to "the number of lags being larger" from the state detector circuit 5 through an input node 6f. The AND circuit performs an AND operation based on the comparison result signal and the state detected signal. For example, the seventh arithmetic circuit 621 outputs a signal shown in FIG. 12(*i*)—which corresponds to a signal at a node "b"—when the comparison result signal corresponding to the "lag" and the state detected signal corresponding to "the number of lags being larger" shown in FIGS. 12(*c*) and 12(*f*), respectively, are inputted.

The second shift register 622 shifts the output of the seventh arithmetic circuit 621 and outputs the shifted result to output nodes 6*k* and 6*m*, when the up edge of the start signal inputted through the input node 6*g* is detected. The second shift register 622 has a D-type flip-flop circuit 623 and an AND circuit 624. The flip-flop circuit 623 receives the output of the seventh arithmetic circuit 621 at a data input node D thereof and accepts the start signal at a clock input node T thereof. Further, the flip-flop circuit 623 has an output node Q electrically connected to the output node 6*m*. The AND circuit 624 performs an AND operation based on the output of the seventh arithmetic circuit 621 and an output supplied from an inverse output node/Q of the flip-flop circuit 623, then outputting the result of the operation to the output node 6*k*.

When the start signal and the output of the seventh arithmetic circuit 621, both of which are respectively shown in FIGS. 12(*a*) and 12(*i*), for example, are inputted to the second shift register 622, a signal shown in FIG. 12(*n*) is output by the output node Q of the flip-flop circuit 623 to the output node 6*m* as a dividing ratio signal corresponding to a "dividing ratio greater than the reference dividing ratio". Hereinafter, the output of the output node 6*m* is referred to as a fifth output. In this embodiment, the fifth output, i.e., the dividing ratio signal output by the output node 6*m* indicates that "the dividing ratio is grater than the reference dividing ratio", specifically, "the dividing ratio is 452" when the level thereof is "H". Further, in the case mentioned above, a signal shown in FIG. 12(*m*) is output by the AND circuit 624 to the output node 6*k* as a dividing ratio signal corresponding to a "dividing ratio grater than the reference dividing ratio". Hereinafter, the output of the output node 6*k* is referred to as a fourth output. In this embodiment, the fourth output, i.e., the dividing ratio signal output by the output node 6*k* indicates that "the dividing ratio is grater than the reference dividing ratio", specifically, "the dividing ratio is 451" when the level thereof is "H".

Namely, when the comparison result signal indicates the "lag" and the state detected signal indicates that "the number of lags is larger", the large dividing ratio generator 62 outputs an "H" level signal from the output node 6*k* (at this time, an "L" level signal is output by the output node 6*m*). The "H" level signal indicates a dividing ratio (451) increased by 1 from the reference dividing ratio (corresponding to 450 in this embodiment). Further, when the comparison result signal indicates the "lag" and the state detected signal indicates that "the number of lags is larger" even in the next data cycle, the large dividing ratio generator 62 outputs an "H" level signal from the output node 6*m* (at this time, an "L" level signal is output by the output node 6*k*). The signal output by the output node 6*m* indicates a dividing ratio (452) increased by 1 from the dividing ratio in the previous data cycle. Even when the comparison result signal indicates the "lag" and the state detected signal indicates that "the number of lags is larger" continuously after the above process, the large dividing ratio generator 62 outputs an "H" level signal from the output node 6*m* (at this time, an "L" level signal is output by the output node 6*k*) so as to thereby indicate that the dividing ratio (452) in the previous data cycle should be kept.

As shown in FIG. 11, the dividing ratio selection circuit 6 includes a reference dividing ratio generator 63. The generator 63 calculates a dividing ratio signal indicative of the "reference dividing ratio" based on the comparison result signal output by the comparator 4 and the state detected signal output by the state detector circuit 5, then outputting the calculated result. The reference dividing ratio generator 63 has eighth through tenth arithmetic circuits 64 through 66.

The eighth arithmetic circuit 64 comprises an AND circuit. The AND circuit receives the comparison result signal corresponding to the "lag" from the comparator 4 through the input node 6*b*, also receives the state detected signal corresponding to "the number of leads being larger" from the state detector circuit 5 through an input node 6*e*. The eighth arithmetic circuit performs an AND operation based on the comparison result signal corresponding to the "lag" and the state detected signal corresponding to "the number of leads being larger". The ninth arithmetic circuit 65 comprises an AND circuit. The AND circuit receives the comparison result signal corresponding to the "lead" from the comparator 4 through the input node 6*a*, also receives a state detected signal corresponding to "the number of lags being larger" from the state detector circuit 5 through the input node 6*f*. The ninth arithmetic circuit 65 performs an AND operation based on the comparison result signal of the "lead" and the state detected signal of "the number of lags being larger". The tenth arithmetic circuit 66 comprises an OR circuit. The OR circuit receives the outputs of the eighth and ninth arithmetic circuits 64 and 65, also receives the comparison result signal corresponding to the "non-detection" from the comparator 4 through an input node 6*c*, further receives the state detected signal corresponding to "the number of leads being equal to the number of lags" from the state detector circuit 5 through an input node 6*d*. The tenth arithmetic circuit 66 performs an OR operation based on the outputs of the eighth and ninth arithmetic circuits 64 and 65, the comparison result signal indicative of the "non-detection" and the state detected signal indicative of the "number of leads being equal to the number of lags". When the signals shown in FIGS. 12(*b*) through 12(*g*), for example, are inputted, a signal shown in FIG. 12(*j*) is output by the tenth arithmetic circuit 66 to an output node 6*j* as a dividing ratio signal corresponding to a "reference dividing ratio". Hereinafter, the output supplied from the output node 6*j* is referred to as a first output. The first output, i.e., the dividing ratio signal output by the output node 6*j* indicates the "reference dividing ratio", specifically, a "dividing ratio of 450" when the level thereof is "H".

Namely, the reference dividing ratio generator 63 outputs an "H" level signal from the output node 6*j* so as to indicate the reference dividing ratio (450) when the comparison result signal indicates the "lag" and the state detected signal indicates "the number of leads being larger", when the comparison result signal indicates the "lead" and the state detected signal indicates "the number of lags being larger", when the comparison result signal indicates the "non-detection", and when the state detected signal indicates "the number of leads being equal to the number of lags".

Incidentally, as discussed above, when the comparison result signal indicates the "lead" and the state detected signal indicates "the number of leads being larger" over two time data cycles in succession, the dividing ratio selection circuit 6 outputs the dividing ratio set in the second data cycle in a data cycle corresponding to a third time or later. However, the data cycle corresponding to the third time or later may be configured so as to take a dividing ratio reduced by 1 from a dividing ratio corresponding to the previous data cycle. In this case, the first shift register 612 of the small dividing ratio generator 61 may be modified to a shift register for outputting 3 bits or more. Similarly, when the comparison result signal indicates the "lag" and the state detected signal indicates "the number of lags being larger" over the two data cycles in succession, the dividing ratio selection circuit 6 outputs the dividing ratio set in the second data cycle in a data cycle corresponding to the third time or later. However, the dividing ratio used in the data cycle corresponding to the three time or later may be set to a dividing ratio increased by 1 from the dividing ratio corresponding to the previous data cycle. In this case, the second shift register 622 of the large dividing ratio generator 62 may be changed to the shift register for outputting 3 bits or more.

Referring again to FIG. 1, the clock signal generator of the present embodiment includes a variable dividing ratio counter 7. The counter 7 receives dividing ratio signals output by the dividing ratio selection circuit 6, also receives a reference clock signal through the reference clock input terminal 3. The counter 7 divides the frequency of the reference clock signal based on a dividing ratio which is determined based on the dividing ratio signals, and outputting the frequency-divided signal to the comparator 4 and the output terminal 2 as a synchronizing clock signal.

Figure 13:
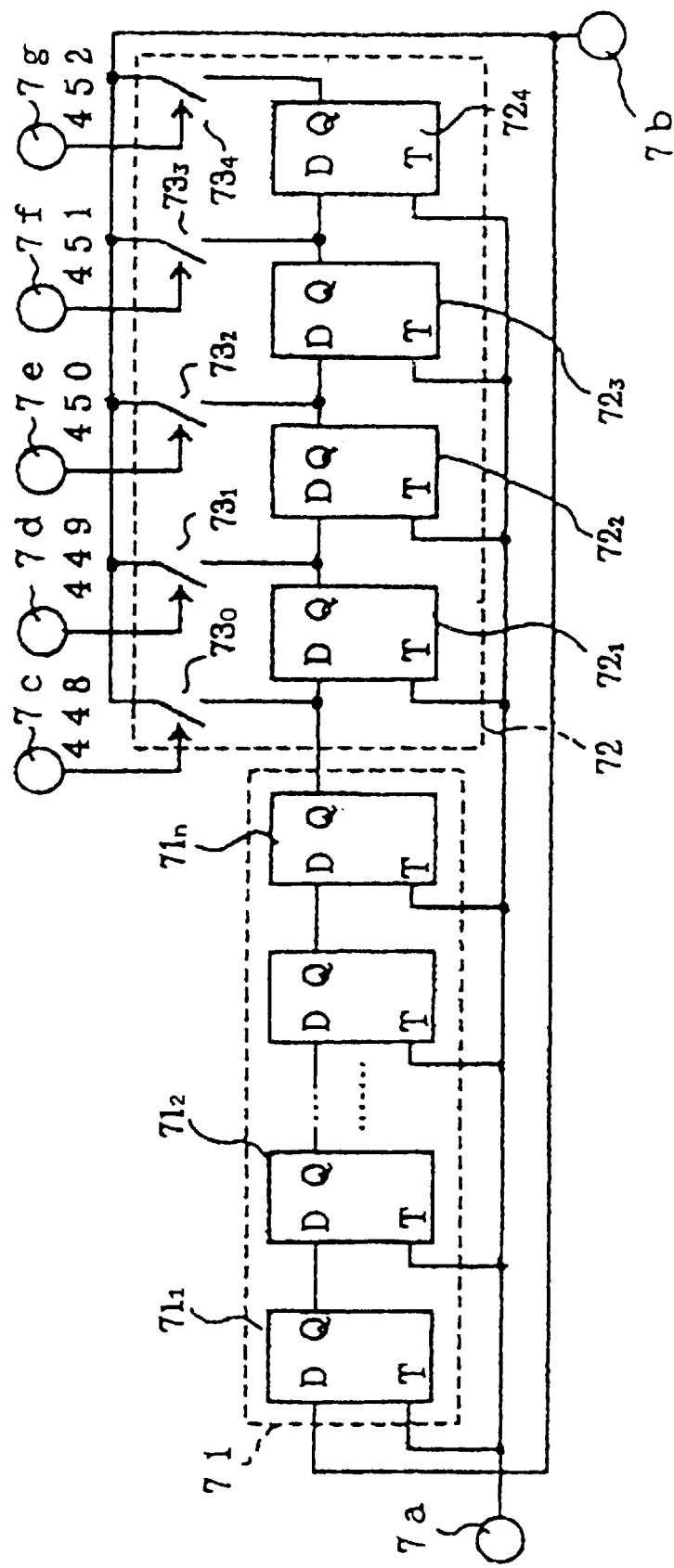
FIG. 13 is a circuit diagram illustrating a variable counter employed in the clock signal generator shown in FIG. 1.

FIG. 13 shows an example of a specific configuration of the variable dividing ratio counter 7. As shown in FIG. 13, the variable dividing ratio counter 7 has an input node 7a to which the reference clock signal is inputted and which is electrically connected to the reference clock input terminal 3. Further, the variable dividing ratio counter 7 has an output node 7b for outputting the synchronizing clock signal. The output node 7b is electrically connected to the output terminal 2. Moreover, the variable dividing ratio counter 7 has dividing ratio signal input nodes 7c through 7g to which the dividing ratio signals output by the dividing ratio selection circuit 6 are inputted. The dividing ratio signal input nodes 7c through 7g are electrically connected to their corresponding output nodes 6h through 6m of the dividing ratio selection circuit 6.

The variable dividing ratio counter 7 includes a maximum synchronizing clock generator 71. The generator 71 divides the frequency of the reference clock signal inputted through the input node 7a and outputting the maximum synchronizing clock signal. The maximum synchronizing clock generator 71 comprises a frequency divider (1/448 frequency divider) in which a plurality of D-type flip-flops 711 through 71n (n=448 in this embodiment) are cascade-connected to one another. The plurality of stages of flip-flops 711 through 71n are identical in configuration to each other and have clock input nodes T supplied with the reference clock signal through the input node 7a. The first-stage flip-flop 711 has a data input node D electrically connected to the output node 7b and supplied with the synchronizing clock signal through the same. The second-stage and later flip-flops 712 through 71n have data input nodes respectively electrically connected to output nodes of the pre-stage flip-flops 711 through 71n−1. The final-stage flip-flop 71n outputs the maximum synchronizing clock signal through an output node Q thereof.

The variable dividing ratio counter 7 includes a synchronizing clock generator 72. The generator 72 receives the maximum synchronizing clock signal output by the maximum synchronizing clock generator 71, also receives the dividing ratio signals output by the dividing ratio selection circuit 6. The variable dividing ratio counter 7 generates a synchronizing clock signal based on the maximum synchronizing clock signal and dividing ratio signals, then outputting the synchronizing clock signal to the output node 7b. The synchronizing clock generator 72 has a plurality of cascade-connected D-type flip-flops 721 through 72m (m=4 in the first embodiment) and a plurality of switch circuits 730 through 73m. The plurality of switch circuits 730 through 73m is provided so as to correspond to the output of the maximum synchronizing clock generator 71 and the outputs of the plurality of flip-flops 721 through 72m. The plurality of stages of flip-flops 721 through 72m are identical in configuration to the flip-flops 711 through 71n and have clock input nodes T supplied with the reference clock signal through the input node 7a. The first-stage flip-flop 721 has a data input node D electrically connected to the output node Q of the final-stage flip-flop 71n of the maximum synchronizing clock generator 71 and supplied with the maximum synchronizing clock signal. The second-stage and subsequent flip-flops 722 through 72m have data input nodes D electrically connected to output nodes Q of the pre-stage flip-flops 721 through 72m−1, respectively.

The plurality of switch circuits 730 through 73m are respectively made up of transistors such as bipolar transistors, MOS transistors or the like having control nodes. The switch circuit 730 is electrically connected to both of the output node Q of the final-stage flip-flop 71n of the maximum synchronizing clock generator 71 and the output node 7b. The switch circuit 730 also has a control node electrically connected to the dividing ratio signal input node 7c. When the dividing ratio signal output by the dividing ratio selection circuit 6 indicates a dividing ratio reduced by 2 from the reference dividing ratio, i.e., when an "H" level signal is output by the output node 6h of the dividing ratio selection circuit 6 in this embodiment, the switch circuit 730 is brought into conduction. As a result, the maximum synchronizing clock signal from the maximum synchronizing clock generator 71 is supplied to the output node 7b and thereafter used as the synchronizing clock signal. At this time, the variable counter 7 comprised of the maximum synchronizing clock generator 71 and the synchronizing clock generator 72 serves as a 1/448 frequency divider.

The switch circuit 731 is electrically connected to both of the output node Q of the flip-flop 721 and the output node 7b and has a control node electrically connected to the dividing ratio signal input node 7d. When the corresponding dividing ratio signal output by the dividing ratio selection circuit 6 indicates a dividing ratio reduced by 1 from the reference dividing ratio, i.e., when an "H" level signal is output by the output node 6i of the dividing ratio selection circuit 6 in the first embodiment, the switch circuit 731 is brought into conduction. As a result, a clock signal from the output node Q of the flip-flop 721 is supplied to the output node 7b and thereafter used as the synchronizing clock signal. At this time, the variable counter 7 comprised of the maximum synchronizing clock generator 71 and the synchronizing clock generator 72 serves as a 1/449 frequency divider.

The switch circuit 732 is electrically connected to both of the output node Q of the flip-flop 722 and the output node 7b and has a control node electrically connected to the dividing ratio signal input node 7e. When the dividing ratio signal output by the dividing ratio selection circuit 6 indicates the reference dividing ratio, i.e., when an "H" level signal is output by the output node 6j of the dividing ratio selection circuit 6 in the first embodiment, the switch circuit 732 is brought into a conducting state. As a result, a clock signal from the output node Q of the flip-flop 722 is supplied to the output node 7b and thereafter used as the synchronizing clock signal. At this time, the variable counter 7 made up of the maximum synchronizing clock generator 71 and the synchronizing clock generator 72 serves as a 1/450 frequency divider.

The switch circuit 733 is electrically connected to both of the output node Q of the flip-flop 723 and the output node 7b and has a control node electrically connected to the dividing ratio signal input node 7f. When the corresponding dividing ratio signal output by the dividing ratio selection circuit 6 indicates a dividing ratio increased by 1 from the reference dividing ratio, i.e., when an "H" level signal is output by the output node 6k of the dividing ratio selection circuit 6 in the first embodiment, the switch circuit 733 is brought into conduction. As a result, a clock signal from the output node Q of the flip-flop 723 is supplied to the output node 7b and thereafter used as the synchronizing clock signal. At this time, the variable counter 7 comprised of the maximum synchronizing clock generator 71 and the synchronizing clock generator 72 serves as a 1/451 frequency divider.

The switch circuit 734 is electrically connected to both of the output node Q of the flip-flop 724 and the output node 7b and has a control node electrically connected to the dividing ratio signal input node 7g. When the dividing ratio signal output by the dividing ratio selection circuit 6 indicates a dividing ratio increased by 2 from the reference dividing ratio, i.e., when an "H" level signal is output by the output node 6m of the dividing ratio selection circuit 6 in the first embodiment, the switch circuit 734 is brought into a conducting state. As a result, a clock signal from the output node Q of the flip-flop 724 is outputted to the output node 7b and thereafter used as the synchronizing clock signal. At this time, the variable counter 7 made up of the maximum synchronizing clock generator 71 and the synchronizing clock generator 72 serves as a 1/452 frequency divider.

Incidentally, in this embodiment, since the dividing ratio signals output by the dividing ratio selection circuit 6 exhibit the five types of dividing ratios, the synchronizing clock generator 72 of the variable counter 7 comprises the four-stage cascade-connected flip-flops 721 through 724. However, when the dividing ratio signals output by the dividing ratio selection circuit 6 indicate (m+1) dividing ratios, the synchronizing clock generator 72 may be comprised of m-stage cascade-connected flip-flops 721 through 72m.

Referring back to FIG. 1, the clock signal generator of the present embodiment includes a start signal generator 8. The generator 8 generates a start signal in response to the synchronizing clock signal output by the variable counter 7 and outputting the same to the comparator 4, the state detector circuit 5 and the dividing ratio selection circuit 6. The start signal generator 8 is made up of an edge detector circuit which detects either the down or up edge— particularly, down edge in this embodiment—of the synchronizing clock signal output by the variable counter 7 so as to thereby output a trigger signal. The edge detector circuit 8 outputs the signal shown in FIG. 5(b), when receiving the synchronizing clock signal shown in FIG. 5(a).

The operation of the clock signal generator constructed in this way will next be described. A description will first be made of the operation (pull-in operation) for synchronizing the synchronizing clock signal with input data when the data is inputted in a state of leading the synchronizing clock signal or inputted in a state of lagging behind the synchronizing clock signal. For simplification of description, the input data will be placed in an ideal condition free of a phase shift and noise.

A description will first be made of the pull-in operation in a case where the input data leads the synchronizing clock signal.

Consider where the power is turned on to allow the clock signal generator to start operating in a data cycle t1 shown in FIG. 14. Since the dividing ratio selection circuit 6 outputs the dividing ratio signal indicative of the "reference dividing ratio (450)" in its initial state, the variable counter 7 divides the frequency of the reference clock signal inputted through the reference clock input terminal 3 with the reference dividing ratio and outputs a synchronizing clock signal shown in FIG. 14(b). Since the synchronizing clock signal is generated in a state of lagging behind the input data at this time, the input data results in a state of leading the synchronizing clock signal until the synchronizing clock signal is synchronized with the input data. Thus, until the synchronization between the synchronizing clock signal and the input data is established, the synchronizing clock signal can be synchronized with the input data when the synchronizing clock signal is obtained by dividing the frequency of the reference clock signal with the "dividing ratio smaller than the reference dividing ratio".

Now consider where the input data shown in FIG. 14(a) is given. The comparator 4 compares the phase of the input data shown in FIG. 14(a) and the synchronizing clock signal shown in FIG. 14(b) and thereby detects that the input data leads the synchronizing clock signal in each of data cycles t1, t2 and t4. Since the input data is placed in a state of leading the synchronizing clock signal until they are synchronized with each other, the state detector circuit 5 outputs a state detected signal indicative of "the number of leads being larger".

Thus, the dividing ratio selection circuit 6 outputs dividing ratio signals indicative of "dividing ratios smaller than the reference dividing ratio" in data cycles t2, t3 and t5. The dividing ratio selection circuit 6 outputs a dividing ratio 449 in the data cycle t2, a dividing ratio 448 in the data cycle t3 and a dividing ratio 449 in the data cycle t5, for example. As a result, the variable counter 7 divides the frequency of the reference clock signal with the "dividing ratios smaller than the reference dividing ratio" in the data cycles t2, t3 and t5 and outputs the result of frequency division to the comparator 4 and the output terminal 2 as the synchronizing clock signal.

The comparator 4 outputs a comparison result signal indicative of a "non-detection" during the same data is sequentially outputted as the input data (e.g., in the data cycle t3) and after the synchronization is established (e.g., in the data cycle t5 or later). Thus, even if the state detector circuit 5 outputs any value of state detected signal, the dividing ratio selection circuit 6 outputs a dividing ratio signal indicative of the "reference dividing ratio" in data cycles t4 and t6 or later. As a result, the variable counter 7 divides the frequency of the reference clock signal with the "reference dividing ratio" in the data cycles t4 and t6 or later and outputs the result of division to the comparator 4 and the output terminal 2 as the synchronizing clock signal.

Thus, since the frequency of the reference clock signal is divided with the "dividing ratio smaller than the reference dividing ratio" except that the same data is continuously outputted as the input data until the synchronizing clock signal is synchronized with the input data, the synchronizing clock signal is promptly brought into synchronization with the input data. Further, when the comparison result signal indicative of the "lead" is sequentially output by the comparator 4, the dividing ratio selection circuit 6 outputs a dividing ratio signal indicative of a dividing ratio further reduced by 1 from the dividing ratio in the previous data cycle. Therefore, the synchronizing clock signal is more promptly brought into synchronism with the input data.

On the other hand, the pull-in operation at the time that the input data is inputted in a state of lagging behind the synchronizing clock signal, is as follows:

Namely, consider where the power is turned on to allow the clock signal generator to start operating in a data cycle t1 shown in FIG. 15. Since the dividing ratio selection circuit 6 outputs the dividing ratio signal indicative of the "reference dividing ratio (450)" in its initial state, the variable counter 7 divides the frequency of the reference clock signal inputted through the reference clock input terminal 3 with the reference dividing ratio and outputs a synchronizing clock signal shown in FIG. 15(b). Since the synchronizing clock signal is generated in a state of leading the input data at this time, the input data results in a state of lagging behind the synchronizing clock signal until the synchronizing clock signal is synchronized with the input data. Thus, until the synchronization between the synchronizing clock signal and the input data is established, the synchronizing clock signal can be synchronized with the input data when the synchronizing clock signal is obtained by dividing the frequency of the reference clock signal with the "dividing ratio greater than the reference dividing ratio".

Now consider where the input data shown in FIG. 15(a)—which is defined as identical to that shown in FIG. 14(a) to provide easy understanding—is given. The comparator 4 compares the phase of the input data shown in FIG. 15(a) and the synchronizing clock signal shown in FIG. 15(b) and thereby detects that the input data lags behind the synchronizing clock signal in each of data cycles t1, t2 and t4. Since the input data is placed in a state of lagging behind the synchronizing clock signal until they are synchronized with each other, the state detector circuit 5 outputs a state detected signal indicative of an "increase in the number of lags" therefrom.

Thus, the dividing ratio selection circuit 6 outputs dividing ratio signals indicative of "dividing ratios greater than the reference dividing ratio" in data cycles t2, t3 and t5. The dividing ratio selection circuit 6 outputs a dividing ratio 451 in the data cycle t2, a dividing ratio 452 in the data cycle t3 and a dividing ratio 451 in the data cycle t5, for example. As a result, the variable counter 7 divides the frequency of the reference clock signal with the "dividing ratios greater than the reference dividing ratio" in the data cycles t2, t3 and t5 and outputs the result of frequency division to the comparator 4 and the output terminal 2 as the synchronizing clock signal.

The comparator 4 outputs a comparison result signal indicative of a "non-detection" during the same data is sequentially-outputted as the input data (e.g., in the data cycle t3) and after the synchronization is established (e.g., in the data cycle t5 or later). Thus, even if the state detector circuit 5 outputs any value of state detected signal, the dividing ratio selection circuit 6 outputs a dividing ratio signal indicative of the "reference dividing ratio" in data cycles t4 and t6 or later. As a result, the variable counter 7 divides the frequency of the reference clock signal with the "reference dividing ratio" in the data cycles t4 and t6 or later and outputs the result of division to the comparator 4 and the output terminal 2 as the synchronizing clock signal.

Thus, since the frequency of the reference clock signal is divided with the "dividing ratio greater than the reference dividing ratio" except that the same data is continuously outputted as the input data until the synchronizing clock signal is synchronized with the input data, the synchronizing clock signal is promptly brought into synchronization with the input data. Further, when the comparison result signal indicative of the "lag" is sequentially output by the comparator 4, the dividing ratio selection circuit 6 outputs a dividing ratio signal indicative of a dividing ratio further increased by 1 from the dividing ratio in the previous data cycle. Therefore, the synchronizing clock signal is more promptly brought into synchronism with the input data.

The operation of the clock signal generator at the time that an actually-used digital signal comprised of character information superimposed on an FM sound or speech signal is inputted as input data, will next be explained with reference to FIG. 16.

Even if the input data is of the digital signal comprised of the character information superimposed on the FM sound signal, the operation (pull-in operation) for synchronizing the synchronizing clock signal with the input data—which operation being performed upon an initiation of the operation of the clock signal generator in response to the turning on of the power or the like—is basically similar to the operations described in FIGS. 14 and 15.

Thus, a description will be made of the case in which the synchronizing clock signal (hereinafter called "receiving-side synchronizing clock signal") is synchronized with the input data (hereinafter called "receiving-side input data") and a synchronizing clock signal (receiving-side synchronizing clock signal) generated from the clock signal generator is slightly shifted in phase from a synchronizing clock signal (hereinafter called "transmitting-side synchronizing clock signal") used upon transmission of the digital signal (hereinafter called "transmitting-side input data") comprised of the character information superimposed on the FM sound signal.

The reason why the shift in phase of the receiving-side synchronizing clock signal (corresponding to the signal obtained by dividing the frequency of the reference clock signal with the reference dividing ratio) from the transmitting-side synchronizing clock signal after the receiving-side synchronizing clock signal has been synchronized with the receiving-side input data, results from the fact that since the frequency of the receiving-side synchronizing clock signal cannot be completely set equal to that of the transmitting-side synchronizing clock signal, a slight phase shift occurs between the receiving-side synchronizing clock signal and the transmitting-side synchronizing clock signal due to their long-duration use.

In this embodiment, a predetermined period during which the state detector circuit 5 performs detection is defined as four data cycles for simplification of illustration. Further, the state detector circuit 5 outputs a state detected signal even during a period of data cycles T1 through T3 shown in FIG. 16. However, the state detected signal of the data cycles T1 through T3 varies due to the relationship between receiving-side input data and a receiving-side synchronizing clock signal in data cycles prior to the data cycle T1. Therefore, the state detected signals are shown in FIG. 16 from the data cycle T4. Incidentally, although the predetermined period has been set as the four data cycles in this embodiment, 16 data cycles were found to be adequate as a result of various trials.

Now consider where transmitting-side input data shown in FIG. 16(a) is transmitted with being synchronized with a transmitting-side synchronizing clock signal shown in FIG. 16(b). Further consider where the receiving-side synchronizing clock signal is slightly delayed from the transmitting-side clock signal in the data cycle T1 at this time as shown in FIG. 16(d).

Moreover, consider where the receiving-side input data is under the influence of noise or the like as indicated by arrows in FIG. 16(c), so that the receiving-side input data is phase shifted from the receiving-side synchronizing clock signal, since the transmitting-side input data is propagated with being superimposed on an FM sound signal.

In each of the data cycles T1, T2, T3 and T4, the comparator 4 receives the input data shown in FIG. 16(a) via the input terminal 1 and receives the synchronizing clock signal shown in FIG. 16(d). Further, the comparator 4 is reset by a start signal (corresponding to the output of the start signal generator 8) shown in FIG. 16(f). As a result, the comparator 8 outputs comparison result signals shown in FIGS. 16(g), 16(h) and 16(i). Namely, the comparator 4 detects a lead of the input data from the synchronizing clock signal in the data cycle T1. Thus, the comparison result signal (shown in FIG. 16(g)) corresponding to the "lead" results in an "H" level in the data cycle T2, whereas the comparison result signals corresponding to others result in an "L" level. Similarly, the comparator 4 brings the comparison result signal corresponding to a "lag" to an "H" level in the data cycle T3, and brings the comparison result signal corresponding to a "non-detection" to an "H" level in the data cycle T4.

The state detector circuit 5 receives the comparison result signals from the comparator 4, specifically, the comparison result signals corresponding to the "lead" and "lag" and is reset by the start signal shown in FIG. 16(f). In the data cycle T4, the state detector circuit 5 counts the numbers of "leads" and "lags" in the four data cycles (T1 through T4) prior to the data cycle T4 as shown in FIGS. 16(j) and 16(k) and thereby outputs state detected signals shown in FIGS. 16(l), 16(m) and 16(n). Namely, the state detected signal (shown in FIG. 16(n)) indicative of "the number of leads being equal to the number of lags" results in an "H" level and the state detected signals indicative of others result in an "L" level.

The dividing ratio selection circuit 6 receives therein the comparison result signals output by the comparator 4 and the state detected signals output by the state detector circuit 5 and is reset by the start signal shown in FIG. 16(f). Thus, the dividing ratio selection circuit 6 outputs dividing ratio signals shown in FIGS. 16(o) through 16(s) in the data cycle T4. Namely, the dividing ratio signal (corresponding to the first output shown in FIG. 16(o)) corresponding to the "reference dividing ratio" results in an "H" level, and the dividing ratio signals corresponding to others result in an "L" level.

In response to the dividing ratio signals, the variable counter 7 sets the dividing ratio to the reference dividing ratio, then dividing the frequency of the reference clock signal inputted through the reference clock input terminal 3 with the reference dividing ratio so as to output the synchronizing clock signal shown in FIG. 16(d) to the comparator 4, the start signal generator 8 and the output terminal 2.

The clock signal generator of the present embodiment operates in the same manner as described above in a data cycle T5 or later. Namely, the comparator 8 outputs the comparison result signals (see FIGS. 16(g) through 16(i)) respectively indicative of the "lead", "lead", "lag", "non-detection", "lag"and , "lag" and "lag", based on the relationship between the input data and the synchronizing clock signal in the immediately preceding data cycle. The state detector circuit 5 outputs the state detected signals (see FIGS. 16(l) through 16(n)) respectively indicative of "the number of leads being larger", "the number of leads being larger", "the number of leads being larger", "the number of leads being larger", "the number of lags being larger", "the number of lags being larger", and "the number of lags being larger", based on the comparison result signals output by the comparator 4 in the four data cycles prior to the data cycle T5.

Further, the dividing ratio selection circuit 6 outputs dividing ratio signals (see FIGS. 16(o) through 16(s)) indicative of a "dividing ratio reduced by 1 from the reference dividing ratio", a "dividing ratio reduced by 2 from the reference dividing ratio", the "reference dividing ratio", the "reference dividing ratio", a "dividing ratio increased by 1 from the reference dividing ratio", and a "dividing ratio increased by 2 from the reference dividing ratio", based on the comparison result signals output by the comparator 4 and the state detected signals output by the state detector circuit 5. The variable counter 7 divides the frequency of a reference clock synchronizing signal with the "dividing ratio reduced by 1 from the reference dividing ratio", the "dividing ratio reduced by 2 from the reference dividing ratio", the "reference dividing ratio", the "reference dividing ratio", the "dividing ratio increased by 1 from the reference dividing ratio" and the "dividing ratio increased by 2 from the reference dividing ratio", based on the dividing ratio signals output by the dividing ratio selection circuit 6 so as to thereby output a synchronizing clock signal.

Thus, even if the receiving-side input data includes many phase shifts with respect to the receiving-side synchronizing clock signal due to noise and a phase shift developed upon propagation, further even if the same data is continuously inputted as the input data as shown in FIG. 16(C), the receiving-side synchronizing clock signal is indirectly synchronized with the transmitting-side synchronizing clock signal through the receiving-side input data. As a result, a stable synchronizing clock signal brought into synchronism with the receiving-side input data is obtained.

The reason why the stable synchronizing clock signal synchronized in phase with the input data is obtained even if the input data is unstable in phase as discussed above, is as follows:

Namely, the state detector circuit 5 detects the relationship in phase between the input data and the synchronizing clock signal during the previous predetermined period, i.e., detects a phase lead and a phase lag during a predetermined period. The clock signal generator of the present embodiment thereby grasp the average phase relation, and determining a dividing ratio based on the latest phase relation and the average phase relation. Thus, the dividing ratio of the variable counter 7 is set to the reference dividing ratio even if a single-shot phase shift due to noise or the like appears as distinct from the average phase relation. Accordingly, the amount of the correction of the phase shift in a mis-direction due to noise or the like can be suppressed. In other words, this makes it hard to correct the phase shift with respect to the single-shot noise or the like.

As a result, a stable synchronizing clock signal can be obtained even if the input data is unstable in phase.

In the following, a data signal generator provided with the clock signal generator shown in FIG. 1 will be described with reference to FIG. 2. In this embodiment, specifically, a data signal generator of a character information display apparatus for receiving a digital signal comprised of character information superimposed on an FM sound signal and displaying the character information on a character information display panel, being provided with the clock signal generator will be described.

The data signal generator shown in FIG. 2 includes an antenna 10 for receiving a propagated signal obtained by superimposing the digital signal comprised of the character information on the FM sound signal. A separator 11 for separating the propagated signal received by the antenna 10 into the FM sound signal and the digital signal and outputting them is connected to the antenna 10. The FM sound signal separated by the separator 11 is supplied to an FM receiver 12. The FM receiver 12 receives the FM sound signal and reproducing it as a sound. The FM receiver 12 is constituted by a commonly known structure.

The separator 11 has an output terminal 13. The digital signal separated by the separator 11 is outputted through the output terminal 13 to a clock signal generator 14. The clock signal generator 14 has an input terminal 1 electrically connected to the output terminal 13 of the separator 11, receiving input data comprised of the digital signal through the input terminal 1, being inputted a reference clock signal therein, and generating a synchronizing clock signal synchronized with the digital signal. The clock signal generator 14 has the circuit configuration shown in FIG. 1. The data signal generator of the present embodiment includes a data capture circuit 15. The circuit 15 has one input terminal electrically connected to the output terminal of the separator 11 and supplied with the input data comprised of the digital signal. The other input terminal of the circuit 15 is electrically connected to an output terminal 2 of the clock signal generator 14 and supplied with the synchronizing clock signal output by the clock signal generator 14. The data capture circuit 15 detects the level of the input data when either the down edge or up edge (the down edge in this embodiment) of the input synchronizing clock signal is detected, and outputting the result of detection as input data having a digital value based on the detected level. The data capture circuit 15 and the clock signal generator 14 constitutes a data signal generator.

The input data output by the data capture circuit 15 is supplied to a data processor 17. The data processor 17 electrically processes the input data output by the data capture circuit 15 and outputting it as character information. The character information produced by the data processor 17 is supplied to a display 18 such as a liquid crystal display or a cathode-ray tube. The display 18 serves as a character information display panel for displaying the character information output by the data processor 17.

The operation of the data signal processor constructed in this way will next be described.

Input data corresponding to a digital signal superimposed on an FM sound signal received by the antenna 10 and separated by the separator 11 is inputted to the input terminal 1 through the output terminal 13 of the separator 11.

The clock signal generator 14 receives the input data through the input terminal 1, receives a reference clock signal through the reference clock signal input terminal 3 and outputs a synchronizing clock signal to the output terminal 2.

The clock signal generator 14 generates the synchronizing clock signal in a manner similar to that described in the clock signal generator shown in FIG. 1. Namely, the comparator 4 compares the phase of the input data inputted through the input terminal 1 and that of the synchronizing clock signal output by the variable counter 7 so as to thereby output a comparison result signal indicative of any of a "lead", a "lag" and a "non-detection" of the edge of the input data inputted for each data cycle with respect to other of the down edge and the up edge of (up edge in this embodiment) the synchronizing clock signal.

The state detector circuit 5 detects the numbers of the "leads" and "lags" in the comparison result signals output by the comparator 4 during a predetermined period comprised of a plurality of continuous data cycles and outputs a state detected signal indicative of any of "the number of "leads" being larger", "the number of lags being larger" and "the number of leads being equal to the number of lags". The dividing ratio selection circuit 6 outputs a dividing ratio signal indicative of any of a "dividing ratio smaller than the reference dividing ratio", a "dividing ratio greater than the reference dividing ratio" and the "reference dividing ratio", based on the comparison result signals output by the comparator 4 and the state detected signals output by the state detector circuit 5. The variable counter 7 divides the frequency of the reference clock signal with a dividing ratio based on the dividing ratio signal output by the dividing ratio selection circuit 6 and outputs the result of division to the comparator 4 and the output terminal 2 as a synchronizing clock signal.

The synchronizing clock signal generated in this way and output by the output terminal 2 is inputted to the data capture circuit 15. The data capture circuit 15 detects the level of the input data output by the output terminal 13 of the separator 11 when one of the down edge and the up edge (the down edge in this embodiment) of the synchronizing clock signal output by the clock signal generator 14 is detected, and outputting the result of detection to the data processor 17 as input data having a digital value based on the detected level.

The data signal generator constructed in this way generates a stable input data of higher accuracy even if the input data is unstable due to noise, phase shifts developed upon propagation or the like.

Namely, even if the input data received by the antenna 10 is unstable in phase, the clock signal generator 14 can obtain a stable synchronizing clock signal synchronized in phase with the input data, i.e., whose other of the down edge and the up edge is synchronized with the edge of the input data, with the same cycle as the data cycle of the input data as the reference, as described in the clock signal generator shown in FIG. 1. Namely, one of the down edge and the up edge of the synchronizing clock signal output by the clock signal generator 14 is located substantially in the center of each data in the input data. Thus, since the detection of the level of the input data by the data capture circuit 15 is performed in response to the one edge of the synchronizing clock signal output by the clock signal generator 14, a digital value of each data in the input data can be detected reliably and accurately.

Further, the present invention is not limited to these embodiments, but variations and modifications may be made without departing from the scope of the present invention.

What is claimed is:

1. A clock signal generator comprising:
   a comparator for comparing phases of an input data comprising a digital signal and a synchronizing clock signal, and outputting comparison result signals respectively indicative of a lead, a lag, and a non-detection of the input data with respect to the synchronizing clock signal for each data cycle;
   a state detector circuit receiving the comparison result signals for counting leads and lags in comparison result signals during a period including a plurality of continuous data cycles, and for outputting state detected signals respectively indicative of when a larger number of leads than lags is counted, a larger number of lags than leads is counted, and an identical number of leads and lags is counted;
   a dividing ratio selection circuit receiving the comparison result signals and the state detected signals, for outputting dividing ratio signals respectively indicative of a dividing ratio smaller than a reference dividing ratio when the comparison result signal indicates a lead and the state detected signal indicates a larger number of leads than lags, for outputting a dividing ratio signal indicative of a dividing ratio larger than the reference dividing ratio when the comparison result signal indicates a lag and the state detected signal indicates a larger number of lags than leads, and for outputting a dividing ratio signal indicative of the reference dividing ratio when the input comparison result signal and the state detected signal do not indicate a dividing ratio smaller or larger than the reference dividing ratio; and a variable dividing ratio counter receiving the dividing ratio signal for dividing a frequency of a reference clock signal by a dividing ratio based on the dividing ratio signal, and for outputting a division result signal to said comparator as a synchronizing clock signal.

2. The clock signal generator as claimed in claim 1, further comprising:

a lead-presence detector circuit for outputting a signal indicative of presence of a lead when an up edge or a down edge of the input data occurs before one of an up edge and a down edge of the synchronizing clock signal in a data cycle;

a lag-presence detector circuit for outputting a signal indicative of presence of a lag when the up edge or the down edge of the input data occurs after the one of the up edge and the down edge of the synchronizing clock signal in a data cycle;

a lead detector circuit for outputting the comparison result signal indicative of a lead when an output of said lead-presence detector circuit indicates presence of a lead and an output of said lag-presence detector circuit does not indicate the presence of a lag;

a lag detector circuit for outputting the comparison result signal indicative of a lag when the signal output by said lead-presence detector circuit does not indicate the presence of a lead and the signal output by said lag-presence detector circuit indicates presence of a lag; and a non-detection detector circuit for outputting the comparison result signal indicative of non-detection when the signal output by said lead-presence detector circuit indicates presence of a lead and the signal output by said lag-presence detector circuit indicates presence of a lag, and when the signal output by said lead-presence detector circuit does not indicate the presence of a lead and the signal output by said lag-presence detector circuit does not indicate the presence of a lag.

3. The clock signal generator as claimed in claim 2, wherein:

said lead-presence detector circuit includes a first flip-flop circuit for receiving the synchronizing clock signal, after inversion to the inverse of the synchronizing clock signal, at a data input node and receiving the input data at a clock input node, a second flip-flop circuit for receiving the inverse of the synchronizing clock signal at a data input node and receiving the input data, after inversion to the inverse of the input data, at a clock input node, and a first arithmetic circuit for performing an OR operation on the outputs of said first and second flip-flop circuits, said lag-presence detector circuit includes a third flip-flop circuit for receiving the synchronizing clock signal at a data input node and receiving the input data at a clock input node, a fourth flip-flop circuit for receiving the synchronizing clock signal at a data input node and receiving the inverse of the input data at a clock input node, and a second arithmetic circuit for performing an OR operation on outputs of said third and fourth flip-flop circuits, said lead detector circuit includes a third arithmetic circuit for performing an Exclusive OR operation on outputs of said first arithmetic circuit and said second arithmetic circuit, and a fourth arithmetic circuit for performing an AND operation on outputs of said first arithmetic circuit and said third arithmetic circuit, said lag detector circuit includes a fifth arithmetic circuit for performing an AND operation on outputs of said second arithmetic circuit and said third arithmetic circuit, and said non-detection detector circuit includes an inverter for inverting the signal output by said third arithmetic circuit.

4. The clock signal generator as claimed in claim 1, wherein said state detector circuit includes:

a number-of-leads counter for counting the leads in the comparison result signals output by said comparator;

a number-of-lags counter for counting the lags in the comparison result signals output by said comparator; and a count value comparator for comparing a count value of said number-of-leads counter and a count value of said number-of-lags counter.

5. The clock signal generator as claimed in claim 4, wherein said number-of-leads counter includes a plurality of flip-flop circuits connected in tandem and having a first stage supplied with the comparison result signal indicative of a lead output by said comparator, and an adder for receiving outputs of said plurality of flip-flop circuits of said number-of-leads counter, and said number-of-lags counter includes a plurality of flip-flop circuits connected in tandem and having a first stage supplied with the comparison result signal indicative of a lag output by said comparator, and an adder for receiving outputs of said plurality of flip-flop circuits of said number-of-lags counter.

6. The clock signal generator as claimed in claim 1, wherein said dividing ratio selection circuit includes:

a small dividing ratio generator for outputting the dividing ratio signal indicative of a dividing ratio smaller than the reference dividing ratio, said small dividing ratio generator having a first arithmetic circuit for receiving the comparison result signals output by said comparator and the state detected signals output by said state detector circuit and performing an OR operation on the comparison result signal indicative of a lead and the state detected signal indicative of a larger number of leads than lags, and a first shift register for receiving an output of said first arithmetic circuit;

a large dividing ratio generator for outputting a dividing ratio signal indicative of the dividing ratio larger than the reference dividing ratio, said large dividing ratio generator having a second arithmetic circuit for receiving the comparison result signals output by said comparator and the state detected signals output by said state detector circuit and performing an AND operation on the comparison result signal indicative of a lag and the state detected signal indicative of a larger number of lags than leads, and a second shift register for receiving an output of said second arithmetic circuit; and a reference dividing ratio generator for receiving the comparison result signals output by said comparator and the state detected signals output by said state detector circuit, having a third arithmetic circuit for performing an AND operation on the comparison result signal indicative of a lag and the state detected signal indicative of a larger number of leads than lags, a fourth arithmetic circuit for performing an AND operation on the comparison result signal indicative of a lead and the state detected signal indicative of a larger number of lags than leads, and a fifth arithmetic circuit for performing an OR operation on the outputs of said third and fourth arithmetic circuits, the comparison result signal indicative of a non-detection and the state detected signal indicative of an identical number of leads and lags.

7. A clock signal generator comprising:

a comparator for outputting a comparison result signal indicating a lead when an edge of an input data is detected upon either of an H level and an L level of a synchronizing clock signal, for outputting a comparison result signal indicative of a lag when the edge of the input data is undetected upon both of the H level and the L level of the synchronizing clock signal in each data cycle, and for outputting a comparison result signal indicative of a non-detection when neither of the comparison result signals indicating a lead or a lag is output;

a state detector circuit for outputting a state detected signal indicative of leads when a number indicative of a lead is larger than a number indicative of a lag in the input comparison result signals during a period comprising a plurality of continuous data cycles, for outputting a state detected signal indicative of lags when the number indicative of the lag is larger than the number indicative of a lead in the comparison result signals during the period, and for outputting a state detected signal indicative of leads equal lags when the number indicative of the lead is identical to the number indicative of the lag in the comparison result signals during the period;

a dividing ratio selection circuit for outputting a dividing ratio signal indicative of a dividing ratio smaller than a reference dividing ratio when the comparison result signal indicates a lead and the state detected signal indicates leads, for outputting a dividing ratio signal indicative of a dividing ratio larger than the reference dividing ratio when the input comparison result signal indicates a lag and the input state detected signal indicates lags, and outputting a dividing ratio signal indicative of the reference dividing ratio when the input comparison result signal and the input state detected signal are otherwise; and a variable dividing ratio counter for dividing a frequency of a reference clock signal by a dividing ratio based on the dividing ratio signal, and outputting a dividing result signal to said comparator as the synchronizing clock signal.

8. The clock signal generator as claimed in claim 7, wherein:

a dividing ratio, smaller than the reference dividing ratio Nn indicated by the dividing ratio signal output by said dividing ratio selection circuits is (N(n-1)-1), which is smaller than a dividing ratio N(n-1) indicated by a dividing ratio signal in a data cycle immediately previous to the output of the dividing ratio Nn, where N is an integer and n indicates the nth data cycle, and a dividing ratio, larger than the reference dividing ratio indicated by the dividing ratio signal output by said dividing ratio selection circuit, is (N(n-1)+1), which is larger than the dividing ratio N(n-1) indicated by the dividing ratio signal in the data cycle immediately previous to the output of the dividing ratio Nn.

9. A data signal generator comprising:

a clock signal generator for receiving input data comprising a digital signal and a reference clock signal and generating a synchronizing clock signal synchronized with the digital signal; and a data capture circuit for detecting input data level at one of a down edge and an up edge of the synchronizing clock signal, and for outputting the input data level so detected as input data having a digital value based on the detected input data level, said clock signal generator including, a comparator for outputting comparison result signals respectively indicative of a lead, a lag, and a non-detection of an edge of the input data input for each data cycle with respect to a down edge and the up edge of the synchronizing clock signal;

a state detector circuit, receiving the comparison result signals, for detecting and counting leads and lags in the comparison result signals during a period of a plurality of continuous data cycles, and for outputting state detected signals respectively indicative of a counted number of leads is larger than a counted number of lags, the counted number of lags is larger than the counted number of leads, and the counted number of leads is equal to the counted number of lags;

a dividing ratio selection circuit, receiving the comparison result signals and the state detected signals, for outputting dividing ratio signals respectively indicative of any of a dividing ratio smaller than a reference dividing ratio, a dividing ratio greater than the reference dividing ratio and the reference dividing ratio, based on the comparison result signals output by said comparator and the state detected signals output by said detector circuit; and a variable dividing ratio counter, receiving the dividing ratio signal, for dividing the frequency of the reference clock signal by a dividing ratio based on the dividing ratio signal output by said dividing ratio selection circuit and for outputting a dividing result signal to said comparator and said data capture circuit as the synchronizing clock signal.

10. The data signal generator as claimed in claim 9, wherein said comparator outputs the comparison result signal indicative of a lead when an edge of the input data is detected prior to an edge of the synchronizing clock signal and thereafter the edge of the input data is undetected in each data cycle, outputs the comparison result signal indicative of a lag when the edge of the input data is undetected prior to the edge of the synchronizing clock signal and thereafter the edge of the input data is detected in each data cycle, and outputs the comparison result signal indicative of a non-detection when neither of the comparison result signals indicative of a lead or a lag is output.

11. The data signal generator as claimed in claim 9, wherein said dividing ratio selection circuit outputs the dividing ratio signal indicative of the dividing ratio smaller than the reference dividing ratio when the comparison result signal input to said dividing ratio selection circuit indicates a lead and the state detected signal input to said dividing ratio selection circuit indicates the counted number of leads is larger than the counted number of lags, outputs the dividing ratio signal indicative of the dividing ratio greater than the reference dividing ratio when the input comparison result signal indicates a lag and the input state detected signal indicates the counted number of lags is larger than the counted number of leads, and outputs the dividing ratio signal indicative of the reference dividing ratio when the input comparison result signal and the state detected signal do not indicate a dividing ratio smaller or larger than the reference dividing ratio.

12. The clock signal generator as claimed in claim 11, wherein:

a dividing ratio, smaller than the reference dividing ratio Nn indicated by the dividing ratio signal output by said dividing ratio selection circuit, is (N(n−1)−1), which is smaller than a dividing ratio N(n−1) indicated by a dividing ratio signal in a data cycle immediately previous to the output of the dividing ratio Nn, where N is an integer and n indicates the nth data cycle, and a dividing ratio, larger than the reference dividing ratio indicated by the dividing ratio signal output by said dividing ratio selection circuit, is (N(n−1)+1), which is larger than the dividing ratio N(n−1) indicated by the dividing ratio signal in the data cycle immediately previous to the output of the dividing ratio Nn.

* * * * *